(12) United States Patent
Motomura

(10) Patent No.: US 8,191,026 B2
(45) Date of Patent: May 29, 2012

(54) SEMICONDUCTOR INTEGRATED CIRCUIT AND SWITCH ARRANGING AND WIRING METHOD

(75) Inventor: Tetsuo Motomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 675 days.

(21) Appl. No.: 12/314,111

(22) Filed: Dec. 4, 2008

(65) Prior Publication Data

US 2009/0184758 A1    Jul. 23, 2009

(30) Foreign Application Priority Data

Jan. 17, 2008   (JP) ................................ 2008-008197

(51) Int. Cl.
*G06F 17/50* (2006.01)
(52) U.S. Cl. ......... 716/119; 716/101; 716/126; 716/139
(58) Field of Classification Search .................. 716/101, 716/119, 126, 139
See application file for complete search history.

(56) References Cited

U.S. PATENT DOCUMENTS

| | | | | |
|---|---|---|---|---|
| 7,750,681 | B2 * | 7/2010 | Ogata | ........................... 326/101 |
| 2009/0079465 | A1 | 3/2009 | Sasaki et al. | |

FOREIGN PATENT DOCUMENTS

| | | |
|---|---|---|
| JP | 2003-158189 | 5/2003 |
| JP | 2003-289245 | 10/2003 |
| JP | 2007-042925 A | 2/2007 |
| WO | WO-2006/114875 A1 | 11/2006 |

OTHER PUBLICATIONS

Japanese Office Action issued Dec. 22, 2009 for corresponding Japanese Application No. 2008-008197.

* cited by examiner

*Primary Examiner* — Thuan Do
(74) *Attorney, Agent, or Firm* — Rader Fishman & Grauer, PLLC

(57) ABSTRACT

A semiconductor integrated circuit includes: a circuit block having a first power supply line to which one of a power supply voltage and a reference voltage is applied, an internal voltage line, and a circuit cell connected between the first power supply line and the internal voltage line; and a plurality of switch cells each including two voltage cell lines each connected electrically to the internal voltage line, two power cell lines each connected electrically to a second power supply line to which another of the power supply voltage and the reference voltage is applied, a control cell line electrically connected to a switch control line, and a transistor electrically connected between the internal voltage line and the second power supply line.

5 Claims, 14 Drawing Sheets

SEMICONDUCTOR INTEGRATED CIRCUIT AND SWITCH ARRANGING AND WIRING METHOD

CROSS REFERENCES TO RELATED APPLICATIONS

The present invention contains subject matter related to Japanese Patent Application JP 2008-008197 filed in the Japan Patent Office on Jan. 17, 2008, the entire contents of which being incorporated herein by reference.

BACKGROUND OF THE INVENTION

1. Field of the Invention

The present invention relates to a semiconductor integrated circuit having a switch cell that controls conduction and shutoff of a power supply path for supplying power to a circuit cell within a circuit block, and a switch arranging and wiring method.

2. Description of the Related Art

MTCMOS (Multi-Threshold Complementary Metal Oxide Semiconductor) technology is known as technology for controlling the shutoff of power supply to a circuit and the cancellation of the shutoff by a switch.

Generally, the threshold voltage of a transistor in a logic circuit or the like needs to be lowered as a design value in order to prevent a signal delay accompanying a decrease in power supply voltage or an element miniaturization. When the threshold voltage of a transistor in a logic circuit or the like is low, a high leakage current occurs. The MTCMOS technology prevents unnecessary consumption of power by a circuit in a stopped state by shutting off a leakage current path of the logic circuit or the like by means of a transistor (power supply switch) designed to have a higher threshold voltage than a transistor in the logic circuit or the like.

In application of the MTCMOS technology to a circuit block, internal voltage lines referred to as a so-called virtual VDD line and a so-called virtual GND line are provided within the circuit block. The internal voltage lines are connected to a global real power supply line (real VDD line) and a real reference voltage line (real VSS line) for establishing connection between blocks outside the circuit block, via a power supply switch for power shutoff and the cancellation of the shutoff.

The power supply switch is provided at three kinds of positions, that is, a position between a functional circuit that is started and stopped repeatedly and the real VDD line, a position between the functional circuit and the real VSS line, and both the positions. In general, a PMOS transistor is used as the switch on the VDD side, and an NMOS transistor is used as the switch on the VSS line side.

The starting and stopping of the functional circuit in the MTCMOS applied block is controlled by a circuit within an MTCMOS non-applied block set in an operating state at all times while supplied with power from the real VDD line and the real VSS line after the semiconductor integrated circuit is started. Alternatively, a configuration can be adopted in which a control signal for controlling the starting and stopping of the functional circuit in the MTCMOS applied block can be input from an external terminal of the semiconductor integrated circuit.

A power supply switch can be realized by a cell within an MTCMOS applied block. More specifically, within an MTCMOS applied block, one or more power supply switches may be provided for each logic circuit cell of an inverter, a NAND circuit, a NOR circuit or the like, or within a functional circuit cell realized by a few logic circuits, and a dedicated power supply switch cell without a logic circuit or a functional circuit may be provided. The switch arrangement within the MTCMOS applied block will hereinafter be referred to as an "internal switch (SW) arrangement," and a semiconductor integrated circuit adopting the arrangement will hereinafter be referred to as an "internal SW arrangement type IC."

As opposed to the internal SW arrangement type IC, a semiconductor integrated circuit in which power supply switches are arranged around a circuit block as an object of power supply control is known (see Japanese Patent Laid-Open No. 2003-289245 and Japanese Patent Laid-Open No. 2003-158189 (hereinafter referred to Patent Document 1), for example). A switch arrangement of this type will hereinafter be referred to as an "external SW arrangement," and a semiconductor integrated circuit adopting the arrangement will hereinafter be referred to as an "external SW arrangement type IC."

The external SW arrangement enables a layout policy for an "MTCMOS switch block" to be determined freely independently of a layout policy for an MTCMOS applied region (logic cell region). When the whole of the MTCMOS switch block is custom-designed, a layout that is advantageous in terms of area can be realized. Thus, the "MTCMOS switch block" is suitably used as a switch external to a circuit block having a general-purpose circuit (for example, a memory, a CPU or the like) referred to as a so-called "macro" as a part or the whole of the circuit block.

SUMMARY OF THE INVENTION

On the other hand, the external SW arrangement requires that switch cells be designed individually depending on the position of the MTCMOS switch block. The external SW arrangement has another disadvantage in that it is not easy to deal with a change in size of the switch cells or a change in the number of switch systems or switch multi-control.

For example, the above Patent Document 1 discloses a pattern of power supply switches disposed on three sides or four sides of a circuit block. However, in designing this pattern, switches having a necessary gate width (gate size in a direction orthogonal to a direction of channel current of a transistor and the length of a gate line) are arranged on each of the three sides or the four sides, and are individually connected to peripheral wiring. At this time, each power supply switch is disposed and wired separately. Thus, with the layout of switch cells as disclosed in Patent Document 1, much time and cost is required for the design of the power supply switches, and a design change is not easy either.

The above is a problem specific to MTCMOS switches. However, the general transistor also has a disadvantage in that when a position where the transistor is disposed is changed, wiring and other elements to which to connect the transistor at the position become different, and in that each time the position where the transistor is disposed is changed, the layer of wiring to be connected to the transistor needs to be changed. In addition, when transistor design itself is made over again, the design takes time and cost unless it is easy to design a pattern.

It is desirable to provide a semiconductor integrated circuit having a switch cell of a configuration that enables arrangement and wiring of (power supply) switches on four sides of the periphery of a circuit block to be performed easily in a short time, and a method of arranging and wiring the switches.

It is also desirable to provide a semiconductor integrated circuit including a transistor of a pattern offering a high degree of freedom of wiring use according to a position where the transistor is disposed.

A semiconductor integrated circuit according to an embodiment of the present invention includes a circuit block and a plurality of switch cells.

The circuit block has, within the circuit block, a first power supply line to which one of a power supply voltage and a reference voltage is applied, an internal voltage line, and a circuit cell connected between the first power supply line and the internal voltage line.

The plurality of switch cells each include two voltage cell lines each connected electrically to the internal voltage line, two power cell lines each connected electrically to a second power supply line to which another of the power supply voltage and the reference voltage is applied, a control cell line electrically connected to a switch control line, and a transistor electrically connected between the internal voltage line and the second power supply line.

In the present semiconductor integrated circuit, the switch cells are arranged on all of four sides of a periphery of the circuit block. In each of the plurality of switch cells, the control cell line passes through a cell center, and is disposed in one direction, the two voltage cell lines are arranged in parallel with the control cell line and in parallel with each other at positions equally distant from the control cell line with the control cell line interposed between the two voltage cell lines, and the two power cell lines are arranged in parallel with the control cell line and in parallel with each other at positions equally distant from the control cell line with the control cell line interposed between the two power cell lines.

The semiconductor integrated circuit in the present invention preferably includes a plurality of unit transistors, wherein the plurality of unit transistors are connected in parallel with each other between the voltage cell lines and the power cell lines, respective control nodes of the plurality of unit transistors are connected to each other via the control cell line disposed in an X-direction, and the plurality of unit transistors are formed in a pattern axisymmetric with respect to each of the X-direction passing through a pattern center of the control cell line and a Y-direction orthogonal to the X-direction.

A switch arranging and wiring method according to an embodiment of the present invention is a method of arranging and wiring a plurality of switches disposed outside a circuit block in which a first power supply line to which one of a power supply voltage and a reference voltage is applied and an internal voltage line are arranged, and a circuit cell is connected between the first power supply line and the internal voltage line. The present arranging method includes the following steps.

(1) A step of forming a switch cell by disposing a transistor, arranging each of two voltage cell lines each connected electrically to the internal voltage line, two power cell lines each connected electrically to a second power supply line to which another of the power supply voltage and the reference voltage is applied, and a control cell line electrically connected to a switch control line axisymmetrically with respect to each of an X-axis and a Y-axis passing through a cell center, and connecting each of the two voltage cell lines, the two power cell lines, and the control cell line to the transistor.

(2) A step of forming a switch block by arranging formed switch cells in a form of a matrix and connecting predetermined switch cells to each of a plurality of switch control lines.

(3) A step of forming an inverted switch block by mirror-inverting created data on the switch block on a line parallel to one of the X-axis and the Y-axis, or rotating the created data on the switch block by 180 degrees (inverted by 180 degrees) on the cell center.

(4) A step of connecting the plurality of switch control lines and the second power supply line between the switch block and the inverted switch block that have been disposed, and connecting the voltage cell lines to the internal voltage line of the circuit block.

The above constitution produces the following effects.

In each of the plurality of switch cells, the two voltage cell lines, the two power cell lines, and the control cell line are arranged symmetrically on both sides of the control cell line passing through the cell center. Therefore, when the switch cell pattern is mirror-inverted, a pattern after the mirror inversion is the same as the original pattern with respect to the cell lines. Even when the top and bottom or the left and right of the switch cell are reversed (rotated by 180 degrees), the original pattern remains the same with respect to the cell lines.

Generally, in pattern design of a semiconductor integrated circuit which design is made by a computer-based CAD aiding device, pattern data is mirror-inverted or rotated by 180 degrees by a simple operation of selecting a pattern and giving an instruction.

Hence, for example, when a switch block in which switch cells are arranged in the form of a matrix is designed up to the formation of a plurality of switch control lines connected to a predetermined number of switch cells, data on another switch block (inverted switch block) to be disposed on an opposite side of the circuit block is created by merely mirror-inverting the designed switch block or rotating the designed switch block by 180 degrees (inverting the designed switch block by 180 degrees) on the cell center. Thus, even when switch control lines cannot be arranged symmetrically with respect to the center of the switch block because of a space, a switch block whose switch control lines have the same distances from the circuit block is created easily.

In designing switch blocks as described above, when there is data on a switch block whose basic design has already been made on the same side, it suffices to create data on another switch block to be disposed on the same side by copying the data on the switch block whose basic design has already been made.

After a necessary number of switch blocks are designed and arranged on each of four peripheral sides of the circuit block according to the above procedure, the switch cells are connected to each other between these switch blocks by the second power supply line and the switch control lines. In this case, the second power supply line is wiring between the switch cells which wiring is to be electrically connected to the two power cell lines, and the switch control lines are wiring between the switch cells which wiring is to be electrically connected to the control cell line. Both of the second power supply line and the switch control lines are, for example, formed by using a wiring layer at a higher level. In addition, the voltage cell lines are connected to the internal voltage line of the circuit block.

Incidentally, in the present invention, the transistors of switch cells may be of either of conductivity types (a P-type and an N-type).

In general, when the power supply voltage (fixed positive voltage) is applied to the second power supply line, a P-type, for example, a PMOS transistor is used for switching of the power supply voltage. Conversely, when the reference voltage (voltage serving as a reference for the power supply voltage or signal potential, for example, a GND voltage) is applied to the second power supply line, an N-type, for example, an NMOS transistor is used for switching of the reference voltage.

When both of a P-type transistor and an N-type transistor are used, the P-type transistor and the N-type transistor are designed as separate cells and used so as to be controlled simultaneously as a pair, or a switch cell of a CMOS configuration or the like is designed by including a PMOS and an NMOS in a mixed manner within the same cell. In either of the case of separating the P-type switch cell and the N-type switch cell from each other and the switch cell of the CMOS configuration or the like, a transistor pattern and various cell lines as described above are formed axisymmetrically with respect to each of an X-axis and a Y-axis passing through a cell center.

A semiconductor integrated circuit according to an embodiment of the present invention is a semiconductor integrated circuit including a transistor, the semiconductor integrated circuit having first wiring connected to a switch control line in an upper layer, two pieces of second wiring, two pieces of third wiring, and a plurality of unit transistors.

The two pieces of second wiring are arranged in parallel with the first wiring and in parallel with each other at positions equally distant from the first wiring with the first wiring interposed between the two pieces of second wiring.

The two pieces of third wiring are arranged in parallel with the first wiring and in parallel with each other at positions equally distant from the first wiring with the first wiring interposed between the two pieces of third wiring.

The plurality of unit transistors include equal numbers of unit transistors formed on one side and another side in a direction orthogonal to a wiring direction of the first wiring, the unit transistors on the one side are connected in parallel with each other between the second wiring and the third wiring and the unit transistors on the other side are connected in parallel with each other between the second wiring and the third wiring, and respective control nodes of the plurality of unit transistors are connected to each other via the first wiring.

All of the first wiring, the second wiring, the third wiring, and the plurality of unit transistors are formed in a pattern axisymmetric with respect to each of a first axis in the wiring direction, the first axis passing through a pattern center of the first wiring, and a second axis passing through the pattern center of the first wiring and orthogonal to the first axis.

This constitution produces the following effects.

As in the case of designing the above-described switch blocks, a pattern with good connectivity to the periphery can be designed by merely performing mirror inversion or 180-degree rotation including a pattern on the periphery of the transistor.

In addition, the whole pattern of the transistor has biaxial symmetry, which is axisymmetry with respect to each of the first axis and the second axis. Thus, for example, by merely designing a quarter region of the power shutoff object circuit block and mirror-inverting pattern data after the design or rotating the pattern data by 180 degrees, data generation for other three quarter regions is completed.

According to the present invention, utilizing the symmetry of wiring of a switch cell, a same wiring pattern is obtained even when mirror inversion or 180-degree rotation is performed, and therefore switches to be arranged on four sides of the periphery of a circuit block can be easily arranged and wired in a short time.

It is thereby possible to provide a semiconductor device having switch cells easily arranged and wired, and a method of arranging and wiring the switches.

In addition, when the transistor has a biaxially symmetric pattern, the design itself of the transistor can be made efficiently in a short time.

DETAILED DESCRIPTION OF THE PREFERRED EMBODIMENTS

Preferred embodiments of the present invention will hereinafter be described with reference to the drawings.

<First Embodiment>

Figure 1:
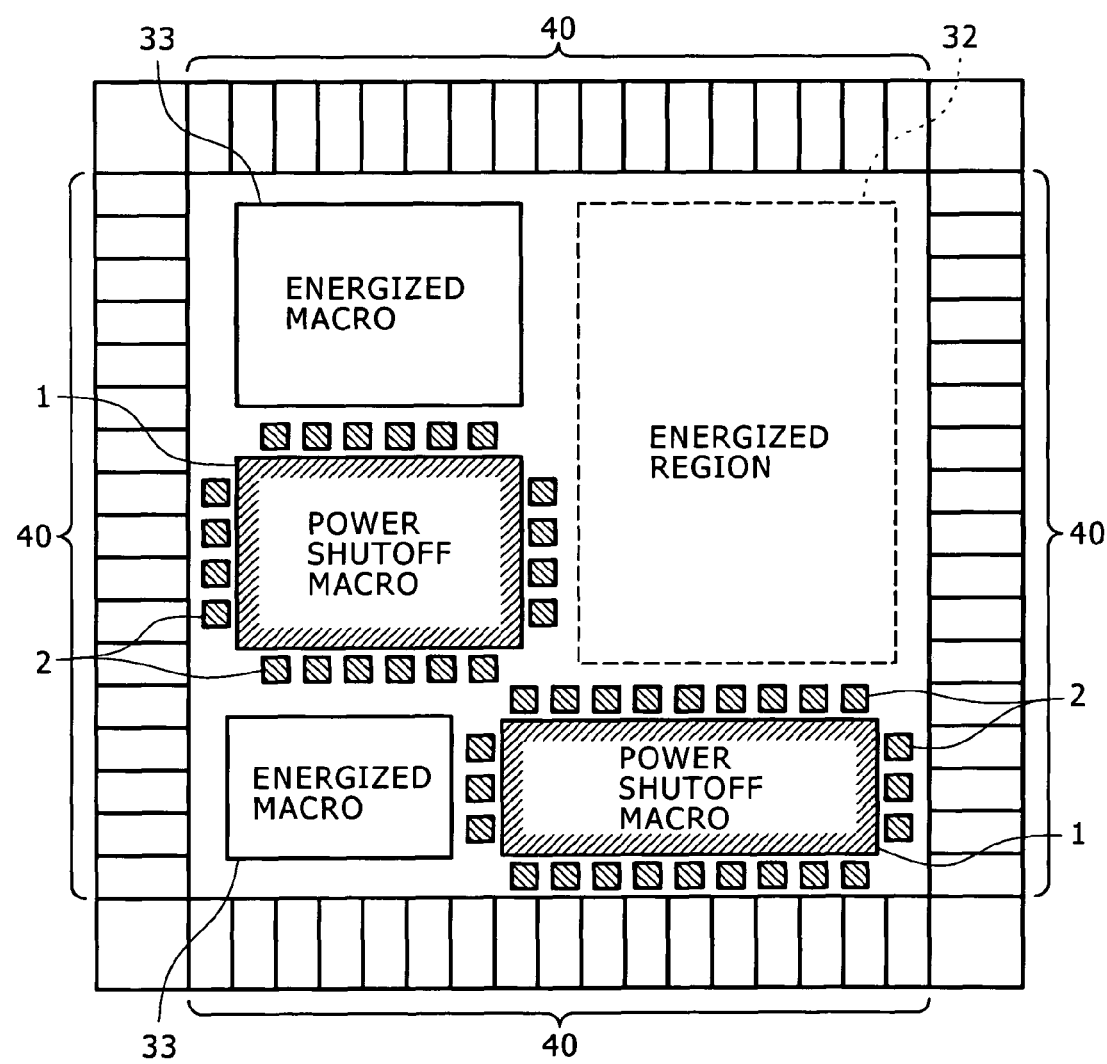
FIG. 1 is a diagram showing a general configuration of a semiconductor integrated circuit according to an embodiment of the present invention.

FIG. 1 shows a general configuration of a semiconductor integrated circuit according to an embodiment of the present invention.

In FIG. 1, a plurality of input-output cells 40 are respectively arranged so as to form a column along four sides of a rectangular semiconductor chip on which the semiconductor integrated circuit is formed.

A number of circuit blocks are arranged in a chip area for circuit arrangement which area is surrounded on all four sides by the input-output cells 40 shown in FIG. 1. In the example shown in FIG. 1, a basic configuration of the semiconductor integrated circuit which configuration is referred to as an "energized region," for example, an energized circuit block 32 including a CPU, a register, a memory, a power supply circuit and the like is disposed in the chip area. The energized circuit block 32 corresponds to a circuit block to which the MTCMOS technology is not applied. The energized circuit block 32 operates while supplied with a power supply voltage VDD and a reference voltage VSS at all times after the semiconductor integrated circuit is started.

A large number of circuit blocks referred to as "macros" and including, in a part thereof or the whole thereof, a general-purpose circuit individually designed so as to be also usable in other semiconductor integrated circuits are further arranged in the chip area for circuit arrangement. The "macros" can be designed by outsourcing, and can be purchased from other companies as IP (Intellectual Property).

The circuit blocks as "macros" can be roughly classified into non-applied circuit blocks 33 referred to as "energized macros" to which the MTCMOS technology is not applied and which operate while supplied with the power supply voltage VDD and the reference voltage VSS at all times after the semiconductor integrated circuit is started as with the energized circuit block 32 and power shutoff object circuit blocks 1 referred to as "power shutoff macros" to which the MTCMOS technology is applied and power to which is shut off as required.

Incidentally, the energized circuit block 32, the non-applied circuit blocks 33, and the power shutoff object circuit blocks 1 arranged in the chip area surrounded by the input-output cells 40 have a pair of a real VDD line and a real VSS line arranged therein, which lines are not shown in FIG. 1, and are thereby supplied with power. More specifically, some of the input-output cells 40 are assigned for power supply, and a pair of real power supply lines is arranged from the input-output cells 40 for power supply in each of a row direction and a column direction within the chip area. Thereby power supply wiring of the energized circuit block 32, the non-applied circuit blocks 33, and the power shutoff object circuit blocks 1 is formed.

The power shutoff object circuit blocks 1 are of the so-called "external SW arrangement type," with switches controlling power shutoff and connection being arranged around the power shutoff object circuit blocks 1. As shown in FIG. 1, a predetermined number of switch blocks 2 including the switches are arranged around the power shutoff object circuit blocks 1.

As described above, in the MTCMOS technology, a switch transistor is provided at three kinds of positions, that is, a position between a functional circuit that is started and stopped repeatedly and a real VDD line, a position between the functional circuit and a real VSS line, and both the positions. In general, a PMOS transistor is used as a switch on the VDD side, and an NMOS transistor is used as a switch on the VSS line side.

A switch transistor in the present embodiment may be provided at any of the three kinds of positions described above. However, providing a switch transistor on both of the VDD side and the VSS side leads to a great disadvantage of an increase in area occupied by the switch transistors, considering effect of providing the switch transistors on both of the VDD side and the VSS side. Therefore a switch transistor is desirably provided on one of the VDD side and the VSS side. In addition, because the NMOS transistor has a higher driving power per unit gate width than the PMOS transistor, it is more desirable that a switch transistor be provided on the VSS side.

Hence, the following description supposes the provision of a switch (transistor) on the VSS side.

Figure 2:
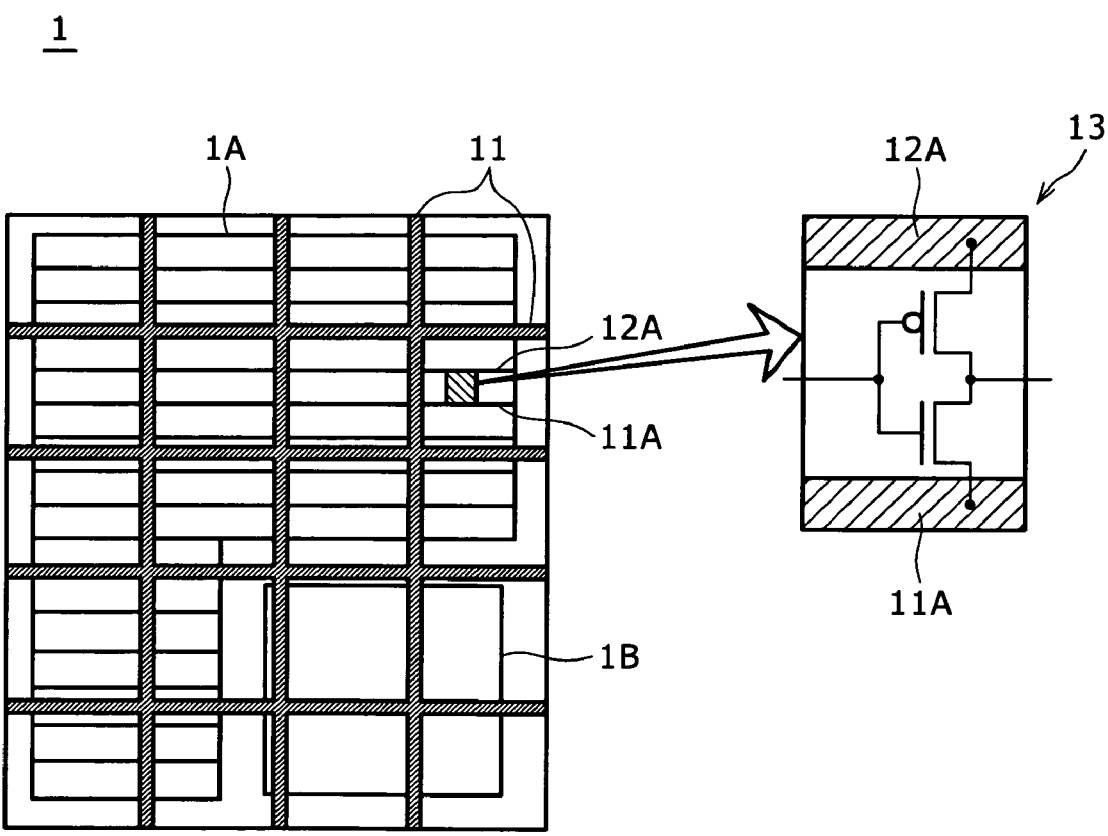
FIG. 2 is a diagram of an internal configuration of a power shutoff object circuit block according to the embodiment.

FIG. 2 shows an example of internal configuration of a power shutoff object circuit block 1.

In the illustrated example of configuration, the power shutoff object circuit block 1 is divided into a standard cell arrangement region 1A in which a functional circuit is realized by a standard cell and a macro cell region 1B of a RAM, for example. Incidentally, for application of the present invention, a "circuit block" as an object for power shutoff control does not need to have a "macro," and may be formed by only a standard cell arrangement region 1A.

In FIG. 2, internal voltage lines 11 that are referred to as so-called "virtual VSS lines" and to which the reference voltage VSS is applied are arranged in parallel with each other in each of a row direction and a column direction on the standard cell arrangement region 1A and the macro cell region 1B. The internal voltage lines 11 in the row direction and the internal voltage lines 11 in the column direction are formed by a wiring layer at a level higher than the cells, and are interconnected at intersections of the internal voltage lines 11 in the row direction and the internal voltage lines 11 in the column direction.

On the other hand, though not shown to avoid complexity, power supply lines that are referred to as a so-called "real VDD line" and to which the power supply voltage VDD is applied and power supply lines to which the reference voltage VSS is applied are similarly arranged in the form of a lattice.

The power supply lines to which the power supply voltage VDD is applied correspond to one form of a "first power supply line," and the power supply lines to which the reference voltage VSS is applied correspond to one form of a "second power supply line." Incidentally, when a path on the power supply voltage VDD side is switch-controlled by a PMOS transistor, relations between the "first power supply line" and the "second power supply line" and between the "power supply voltage VDD" and the "reference voltage VSS" are opposite from those of the present example in which a path on the reference voltage VSS side is switch-controlled by an NMOS transistor.

In the standard cell arrangement region 1A, a plurality of branch lines 11A extend in the row direction at predetermined intervals from column direction trunk wiring of the internal voltage lines 11 as "virtual VSS lines." In addition, in the standard cell arrangement region 1A, a plurality of branch lines 12A extend in the row direction at predetermined intervals from column direction trunk wiring of the voltage supply lines as "real VDD lines" not shown in FIG. 2.

FIG. 2 shows one inverter cell 13 in an enlarged state, the inverter cell 13 representing standard cells. The inverter cell 13 has a VSS line segment forming a part of a branch line 11A and a VDD line segment forming a part of a branch line 12A. A PMOS transistor and an NMOS transistor are connected in series with each other between the two segments. The gates of the PMOS transistor and the NMOS transistor are both connected to an input signal line. A node between the PMOS transistor and the NMOS transistor is connected to an output signal line. The input signal line and the output signal line are formed by signal line segments within the inverter cell 13 and adjacent cells. However, an input and an output line of the whole of the standard cell arrangement region 1A are formed by a wiring layer (not shown) at a higher level.

Figure 3:
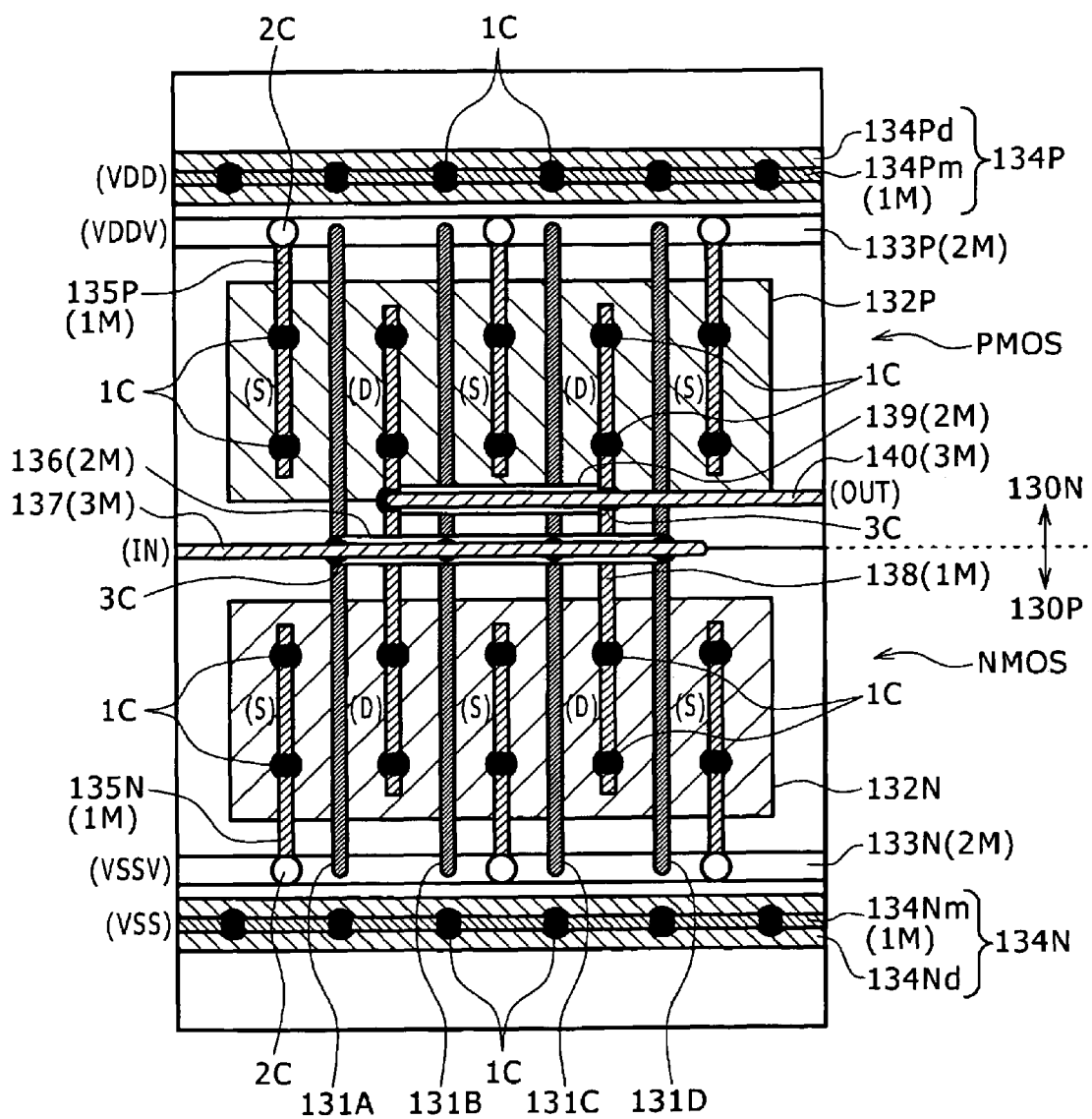
FIG. 3 is a schematic layout diagram showing an example of an inverter cell as an example of a standard cell in the circuit block according to the embodiment.

FIG. 3 is a layout diagram showing an example of an inverter cell.

Incidentally, this layout diagram shows an inverter corresponding to a type on which power shutoff control is performed by a PMOS switch and an NMOS switch unlike the inverter cell 13 in FIG. 2, and which inverter is connected between a "virtual VSS line" and a "virtual VDD line." The size and the like of a pattern in FIG. 3 are not equal to those of an actual pattern. FIG. 3 merely schematically shows the rough arrangement and connection relation of the pattern.

A P-type well (P-well) 130P resulting from selectively introducing a P-type impurity into a semiconductor substrate is formed in a half (lower half of FIG. 3) of the inverter cell illustrated in FIG. 3. An N-type well (N-well) 130N resulting from selectively introducing an N-type impurity into the semiconductor substrate is formed in another half (upper half of FIG. 3). A PMOS transistor is formed in the N-well 130N. An NMOS transistor is formed in the P-well 130P.

Four gate electrodes 131A, 131B, 131C, and 131D extending on each well region are formed with a boundary between the P-well 130P and the N-well 130N as a center.

In the N-well 130N, a P+ type active region 132P serving as a source (S) or a drain (D) of the PMOS transistor is formed by selectively introducing a P-type impurity into the N-well 130N with the four gate electrodes 131A to 131D as a mask.

Similarly, in the P-well 130P, an N+ type active region 132N serving as a source (S) or a drain (D) of the NMOS transistor is formed by selectively introducing an N-type impurity of a relatively high concentration into the P-well 130P with the four gate electrodes 131A to 131D as a mask.

The P+ type active region 132P and the N+ type active region 132N are each formed by five regions divided by the gate electrode parts and alternately functioning as a source (S) and a drain (D).

In the PMOS arrangement region, a branch line (hereinafter referred to simply as a VDDV line) 133P of a "virtual VDD line" and a branch line (hereinafter referred to simply as a VDD line) 134P of a "real VDD line" are arranged in parallel with each other on an end side of the gate electrodes 131A to 131D.

The VDDV line 133P is formed by a second wiring layer (that is a wiring layer at a second level and which will be denoted as (2M)). A source line 135P connected to the source (S) of the PMOS transistor via a 1st contact 1C is formed by a first wiring layer (that is a wiring layer at a first level and which will be denoted as (1M)). The VDDV line 133P is connected to an end part of the source line 135P via a 2nd contact 2C.

The VDD line 134P includes a wiring region 134Pd formed simultaneously with the N+ type active region 132N and lining wiring 134Pm formed of the first wiring layer (1M). The wiring region 134Pd and the lining wiring 134Pm are short-circuited at equal intervals by 1st contacts 1C.

In the NMOS arrangement region, a branch line (hereinafter referred to simply as a VSSV line) 133N of a "virtual VSS line" and a branch line (hereinafter referred to simply as a VSS line) 134N of a "real VSS line" are arranged in parallel with each other on another end side of the gate electrodes 131A to 131D.

The VSSV line 133N is formed by the second wiring layer (2M). A source line 135N connected to the source (S) of the NMOS transistor via a 1st contact 1C is formed by the first wiring layer (1M). The VSSV line 133N is connected to an end part of the source line 135N via a 2nd contact 2C.

The VSS line 134N includes a wiring region 134Nd formed simultaneously with the P+ type active region 132P and lining wiring 134Nm formed of the first wiring layer (1M). The wiring region 134Nd and the lining wiring 134Nm are short-circuited at equal intervals by 1st contacts 1C.

The gate electrodes 131A to 131D are each connected to a gate common line 136 formed of the second wiring layer (2M) via a 2nd contact 2C (not shown). The gate common line 136 is connected to an input line 137 formed of a third wiring layer (that is a wiring layer at a third level, and which will be denoted as (3M)) via a 3rd contact 3C.

The drain (D) of the PMOS transistor and the drain (D) of the NMOS transistor are each connected to drain lines 138 formed of the first wiring layer (1M) via 1st contacts 1C. The two drain lines 138 are each connected to a drain common line 139 formed of the second wiring layer (2M) via a 2nd contact 2C (not shown). The drain common line 139 is connected to an output line 140 formed of the third wiring layer (3M) via a 3rd contact 3C.

Figure 4:
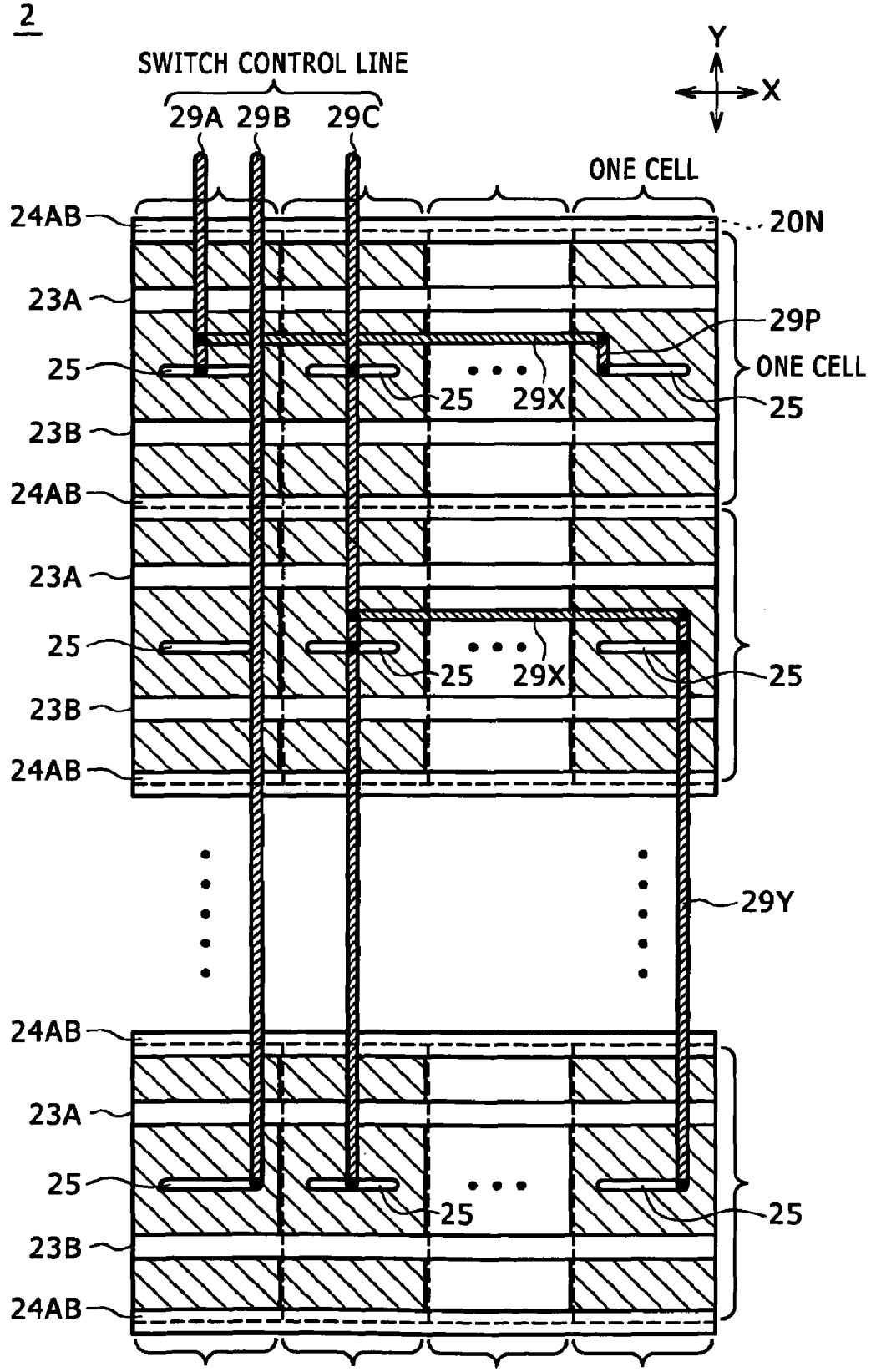
FIG. 4 is a schematic diagram of a configuration of a switch block according to the embodiment.
Figure 5:
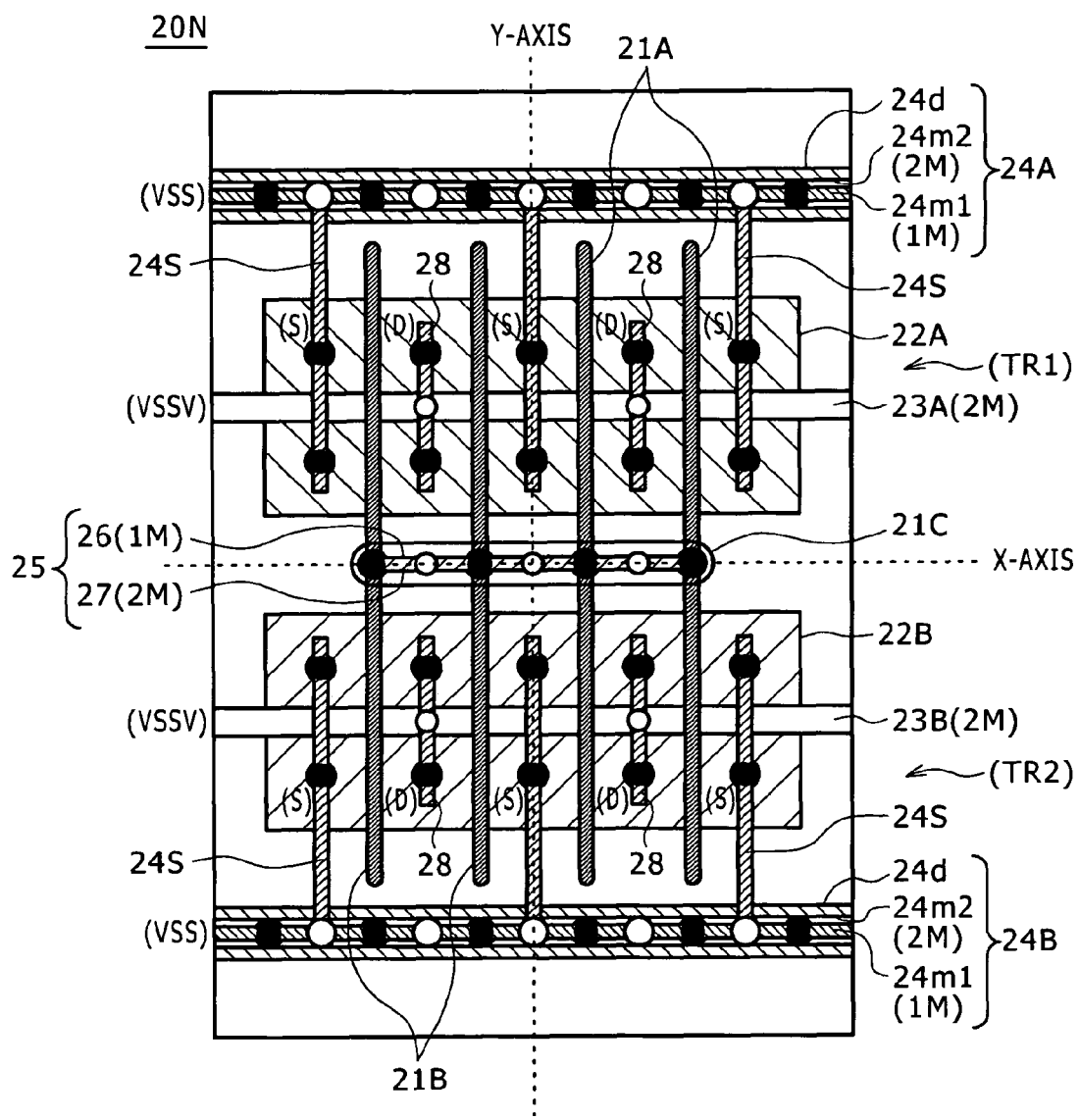
FIG. 5 is a schematic layout diagram of a switch cell according to the embodiment.

FIG. 4 shows an example of configuration of a switch block 2 in FIG. 1. FIG. 5 is a schematic layout diagram of one switch cell. Description will first be made of a layout of the switch cell, which layout is a feature of the present embodiment, with reference to FIG. 5.

The switch cell 20N shown in FIG. 5 is formed by converting one NMOS transistor into a standard cell. The switch cell 20N has an arrangement axisymmetric with respect to each of an X-axis and a Y-axis passing through the center of the cell. This symmetry will hereinafter be referred to as "biaxial symmetry."

The entire region of the switch cell 20N illustrated in FIG. 5 forms a part of a P-well.

A gate electrode coupling part 21C passing through the center of the cell along the X-axis is formed. The lengths of the coupling part 21C from the center of the cell are the same (symmetric) with the Y-axis as a boundary. That is, the coupling part 21C has a pattern of biaxial symmetry.

Four gate electrodes 21A of a same length extend from the coupling part 21C on one side in a width direction of the coupling part 21C, and four gate electrodes 21B of the same length extend from the coupling part 21C on another side of the coupling part 21C. The four gate electrodes 21A are arranged at equal intervals in the direction of the X-axis. The four gate electrodes 21B are similarly arranged at equal intervals in the direction of the X-axis. Because the gate electrodes 21A and the gate electrodes 21B all have the same length and a same thickness, the gate electrodes 21A and the gate electrodes 21B are symmetric with respect to the Y-axis. Because the gate electrodes 21A and 21B branch off from the same positions of the coupling part 21C, the gate electrodes 21A and 21B are symmetric with respect to the X-axis. The coupling part 21C and the gate electrodes 21A and 21B are formed integrally with each other by treating a same conductive material.

Two N+ type active regions 22A and 22B of the same size are formed in the P-well at equal distances from the X-axis. The N+ type active region 22A is formed in a position in which the N+ type active region 22A intersects the four gate electrodes 21A. The N+ type active region 22B is formed in a position in which the N+ type active region 22B intersects the four gate electrodes 21B. The N+ type active regions 22A and 22B are formed by selectively introducing an N-type impurity of a relatively high concentration into the P-well with the gate electrodes 21A and 21B as a mask after the gate electrodes 21A and 21B are formed.

The N+ type active regions 22A and 22B are each formed of five regions divided by the parts of the gate electrodes and alternately functioning as a source (S) and a drain (D).

Thereby, a basic structure having biaxial symmetry is formed which structure includes a first unit transistor (TR1) having the parts dividing the N+ type active region 22A as a channel and a second unit transistor (TR2) having the parts dividing the N+ type active region 22B as a channel.

In the region in which the first unit transistor (TR1) is disposed, a voltage cell line 23A formed of the second wiring layer (2M) is disposed so as to be orthogonal to the four gate electrodes 21A. Similarly, in the region in which the second unit transistor (TR2) is disposed, a voltage cell line 23B formed of the second wiring layer (2M) is disposed so as to be orthogonal to the four gate electrodes 21B.

The two voltage cell lines 23A and 23B are each a cell internal line electrically connected to an internal voltage line 11 within the circuit block 1 (see FIG. 2, and a branch line of the internal voltage line 11 corresponds to the VSSV line 133N in FIG. 3) by a layer higher than the voltage cell lines 23A and 23B.

Two drain lines 28 connected to two respective drains (D) via a 1st contact 1C in each of the N+ type active regions 22A and 22B are provided. The two drain lines 28 in each of the N+ type active regions 22A and 22B or a total of four drain lines 28 are formed by the first wiring layer (1M).

The voltage cell line 23A is connected to the two drain lines 28 on the N+ type active region 22A via a 2nd contact 2C. Similarly, the voltage cell line 23B is connected to the two drain lines 28 on the N+ type active region 22B via a 2nd contact 2C.

The two voltage cell lines 23A and 23B are parallel with each other, and arranged at equal distances from the X-axis.

A power cell line 24A parallel with the voltage cell line 23A is disposed on an end side of the four gate electrodes 21A. Similarly, a power cell line 24B parallel with the voltage cell line 23B is disposed on an end side of the four gate electrodes 21B.

The power cell lines 24A and 24B are each a cell internal line electrically connected to the real VSS line as the "second power supply line" by a wiring layer higher than the power cell lines 24A and 24B. Thus, the two power cell lines 24A and 24B are electrically connected to the VSS line 134N in FIG. 3.

The two power cell lines 24A and 24B each include a wiring region 24d formed simultaneously with the P+ type active region 132P of the logic cell in FIG. 3 and the like, first lining wiring 24m1 formed of the first wiring layer (1M), and second lining wiring 24m2 formed of the second wiring layer (2M).

In each of the two power cell lines 24A and 24B, the wiring region 24d and the first lining wiring 24m1 are short-circuited by a 1st contact 1C at equal intervals, and the first lining wiring 24m1 and the second lining wiring 24m2 are short-circuited by a 2nd contact 2C at equal intervals.

The first lining wiring 24m1 forming the power cell line 24A is formed integrally with two source lines 24S extending on two source (S) sides of the N+ type active region 22A. Similarly, the first lining wiring 24m1 forming the power cell line 24B is formed integrally with two source lines 24S extending on two source (S) sides of the N+type active region 22B.

The sources (S) are connected to the source lines 24S via a 1st contact 1C.

In this case, the gate electrode coupling part 21C described first can be omitted, and is replaceable by four contact pad parts.

In either case, as a whole, the four gate electrodes formed by the gate electrodes 21A and 21B parallel with the Y-axis are short-circuited by a wiring layer higher than the gate electrodes. Cell internal wiring short-circuiting the gate electrodes will be referred to as a "control cell line."

The control cell line 25 in the present example is formed by superimposing a second control cell line 27 formed of the second wiring layer (2M) on a first control cell line 26 formed of the first wiring layer (1M). The coupling part 21C (or the four contact pad parts) and the first control cell line 26 are connected to each other by a 1st contact 1C. The first control cell line 26 and the second control cell line 27 are connected to each other by a 2nd contact 2C.

The control cell line 25 is disposed along the X-axis with the centers in the direction of width and the direction of length of the control cell line 25 coinciding with the center of the cell.

Thus, the control cell line 25 as "first wiring" is disposed in parallel with each of the two voltage cell lines 23A and 23B as "second wiring (or third wiring)" and the two power cell lines 24A and 24B as "third wiring (or second wiring)."

Figure 6:
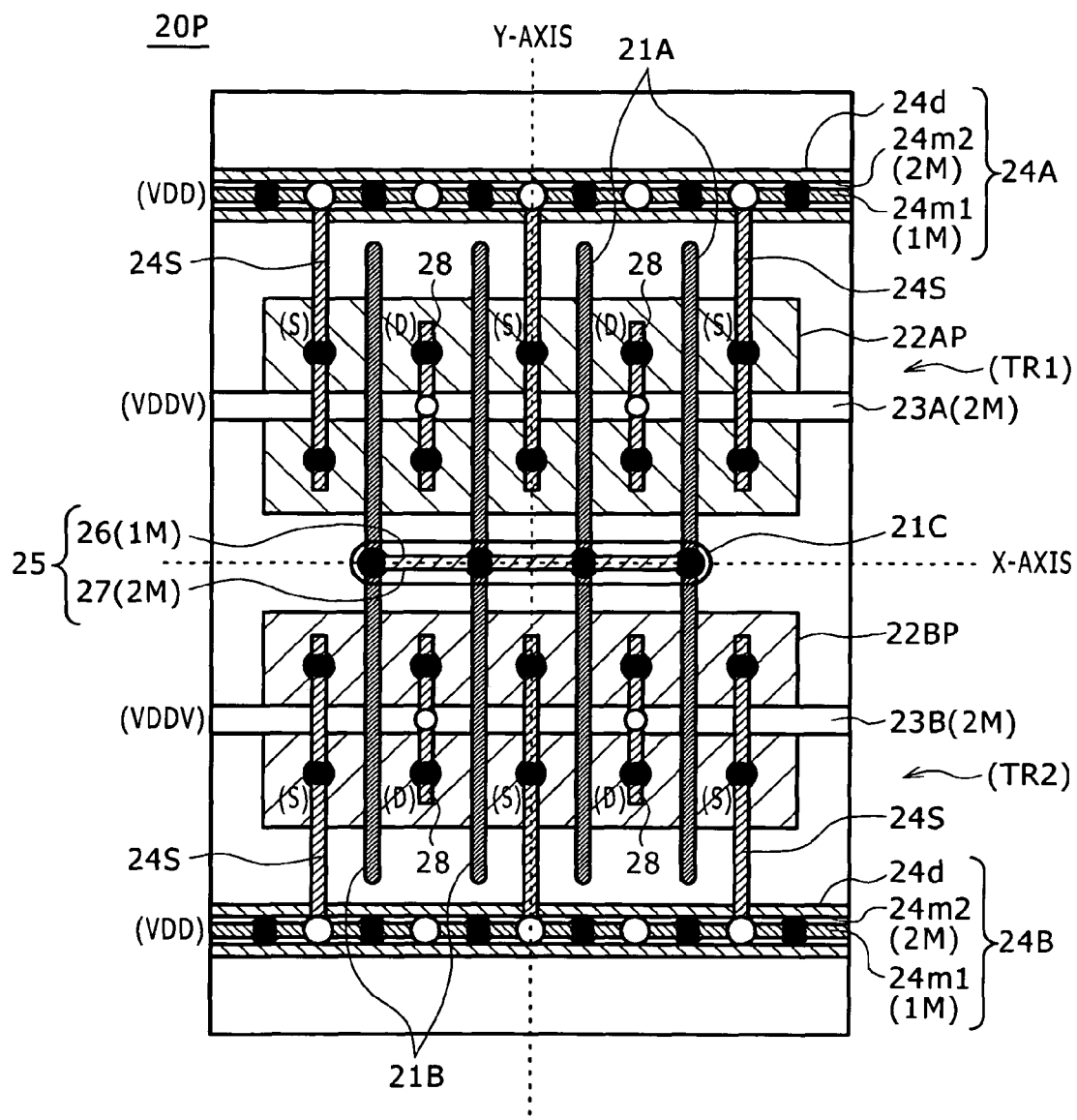
FIG. 6 is a schematic layout diagram of another switch cell according to the embodiment.

FIG. 6 shows a switch cell 20P of a PMOS transistor.

The switch cell 20P illustrated in FIG. 6 differs from the switch cell 20N of FIG. 5 in that the whole of the switch cell 20P is formed in an N-well and the active regions of a first unit transistor (TR1) and a second unit transistor (TR2) formed in the N-well are P+ type active regions 22AP and 22BP. In addition, whereas the wiring region 24d in FIG. 5 is formed by a P+ type impurity region, a wiring region 24d in FIG. 6 is formed by an N+ type impurity region. This N+ type impurity region (the wiring region 24d in FIG. 6) are formed simultaneously with the N+ type active region 132N and the wiring region 134Pd in FIG. 3 and the N+ type active regions 22A and 22B in FIG. 5. Other configuration is the same as in FIG. 5. Therefore, the same reference numerals are provided to the other configuration, and description thereof will be omitted.

In the switch block 2 of FIG. 4, a predetermined number of switch cells 20N as shown in FIG. 5 are arranged in each of the direction of the X-axis (row direction) and the direction of the Y-axis (column direction), and are thus spread all over the switch block 2 in the form of tiles. Two adjacent cells of the switch cells 20N used in this case share the power cell lines 24A and 24B in FIG. 5. The shared power cell lines are denoted by a reference "24AB" in FIG. 4. In addition, FIG. 4 shows only the voltage cell lines 23A and 23B and the control cell line 25 of the switch cell 20N shown in FIG. 5.

FIG. 4 shows an example of configuration for connecting three switch control lines 29A, 29B, and 29C to control cell lines 25 forming the center of arrangement of the cell lines which are arranged symmetrically and in parallel with each other. Specifically, the switch control lines 29A, 29B, and 29C are arranged in parallel with each other in the direction of the Y-axis. The switch control lines 29A, 29B, and 29C are formed of a third wiring layer (3M) or a higher wiring layer.

In the present example, one X-direction connecting line 29X is provided to each of the switch control lines 29A and 29C, for example, by wiring higher than the switch control lines 29A, 29B, and 29C, which wiring is a fourth wiring layer (4M) or higher. In addition, a Y-direction connecting line 29Y formed by a wiring layer lower than the X-direction connecting line 29X (which layer may be higher than the X-direction connecting line 29X) is connected to a line end part of the X-direction connecting line 29X. The X-direction connecting line 29X and the Y-direction connecting line 29Y are wiring for connecting the switch control lines 29A to 29C to the control cell lines 25 of predetermined switch cells 20N in each of the X-direction and the Y-direction.

Incidentally, when a plurality of control cell lines 25 of a plurality of switch cells 20N in the Y-direction are not connected by a Y-direction connecting line 29Y, a contact pad layer 29P is formed of the same wiring layer as the Y-direction connecting line 29Y, as shown in FIG. 4.

The method of use and the method of connection of the wiring layers as described above are one example, and the present invention is not limited thereto.

Though not shown in FIG. 4, the "second power supply line (real VSS line)" needs to be connected to the power cell line 24AB of the switch block 2, and the voltage cell lines 23A and 23B need to be electrically connected to an internal voltage line 11 (FIG. 2) within the power shutoff object circuit block 1. Thus, the switch control lines 29A to 29C cannot be arranged symmetrically with respect to the center of the switch block 2 in many cases. Further, in some cases, the switch control lines 29A to 29C may be disposed further away from the block center in FIG. 4, that is, outside a cell arrangement region.

Although increasing the number of wiring layers enables the symmetric arrangement of the switch control lines with respect to the block center, it is not desirable to complicate wiring structure and raise manufacturing cost only for a purpose of the symmetric arrangement.

Description will next be made of advantages of the wiring symmetric structure of switch cells in a case where the switch control lines cannot be thus arranged symmetrically with respect to the block center.

Description will be made of the ease of design of switch blocks as a first advantage.

A preferable switch arranging and wiring method (switch block designing method) in the present embodiment follows the following procedure utilizing layout symmetry of the switch cell 20N.

First step: Transistors are arranged, and each of two voltage cell lines 23A and 23B to be each electrically connected to an internal voltage line 11, two power cell lines 24A and 24B (or two shared power cell lines 24AB) to be each electrically connected to a second power supply line to which the power supply voltage VDD (in the case of the switch cell 20P) or the reference voltage VSS (in the case of the switch cell 20N) is applied, and a control cell line 25 to be electrically connected to a switch control line 29A to 29C is arranged axisymmetrically with respect to each of the X-axis and the Y-axis passing through the center of the cell, and is connected to the transistors. Thereby the switch cell 20N or 20P (or both thereof) is formed.

Second step: Formed switch cells 20N or 20P (or both thereof) are arranged in the form of a matrix. Predetermined switch cells 20N or 20P (or both thereof) are connected to each of the plurality of switch control lines 29A to 29C. Thereby a switch block 20 is formed.

Third step: Created data on the switch block 2 is mirror-inverted on a line parallel to the X-axis or the Y-axis, or rotated by 180 degrees (inverted by 180 degrees) on a cell center. Thereby an inverted switch block is formed.

Fourth step: The plurality of switch control lines 29A to 29C and the second power supply line are connected between the switch block and the inverted switch block that have been disposed. The voltage cell lines 23A and 23B are connected to the internal voltage lines 11 of the circuit block 1.

Making description more specifically, though the description partly overlaps, the control cell line 25, the voltage cell lines 23A and 23B, and the power cell lines 24A and 24B (or the two power cell lines 24AB) are symmetric with respect to each of the X-axis and the Y-axis. Thus, even when the switch cell 20N is mirror-inverted with a line along the X-axis or the Y-axis as an inversion axis or rotated by 180 degrees on a cell center, positional relation between the five cell lines described above remains in the original state.

In the case of FIG. 5 in which even the transistors are arranged biaxially symmetrically, in particular, even when the whole of a certain switch block 2 is mirror-inverted or rotated by 180 degrees in a stage in which design up to the switch control lines is made as in FIG. 4, for example, the basic pattern of each switch cell 20N as shown in FIG. 5 in a switch cell group in the form of a matrix is not changed at all. A change is made to the switch control lines 29A to 29C and connecting lines thereof (the X-direction connecting line 29X, the Y-direction connecting line 29Y and the like), which are not arranged symmetrically within the block and are formed by wiring layers that are the third wiring layer (3M) and higher as shown in FIG. 4.

Wiring between blocks is easy when distances from the circuit block 1 to the respective switch control lines 29A to 29C are the same. In addition, there is often a restriction requiring that the orientation (direction of length) of the gates of transistors be the same within an integrated circuit for uniform characteristics. In such a case, switch blocks arranged on the four sides of the circuit block 1 have a different pattern for each side.

In the present embodiment, switch blocks can be designed easily by the method having the procedure of the first to fifth steps described above.

Utilizing the fact that the relation between the five cell lines is not changed after mirror inversion or 180-degree rotation and wiring in higher layers than the cell lines is changed, after one switch block 2 to be disposed on one side of two opposed sides of the circuit block 1 is designed in the first and second steps, data on the switch block 2 after the design is mirror-inverted on a line parallel to the two sides or rotated by 180 degrees. Thereby data on another switch block 2 to be disposed on the other side can be created easily (the third step).

Similarly, for the other two sides, after a switch block 2 to be disposed on one of the sides is designed in the first and second steps, data after the design is mirror-inverted or rotated by 180 degrees (the third step). Thereby data on a switch block 2 to be disposed on the other side can be created easily.

The respective distances of the switch control lines 29A to 29C in the four kinds of switch blocks 2 thus created to the circuit block 1 are the same between the four kinds of switch blocks 2. It is therefore easy to connect the switch control lines between blocks in the fourth step. This is also true for other wiring to be connected between switch blocks.

Description will next be made of the ease of switch cell design itself as a second advantage.

When even the pattern of transistors has biaxial symmetry as in FIG. 5 and FIG. 6 in addition to the symmetry of the five cell lines, one of patterns of a first to a fourth quadrant divided by the X-axis and the Y-axis (which patterns will hereinafter be referred to as quarter divided patterns) is designed, and thereafter the other three quarter divided patterns are formed by merely copying pattern data after the design and pasting the pattern data after performing mirror inversion or a combination of mirror inversion and 180-degree rotation. Thereby the design of switch cells is completed.

Thus, switch cells can be designed very easily. In addition, when high-density design is made such that a maximum gate width can be secured in a stage of the first design of a quarter divided pattern, switch cells can be designed without a waste.

A third advantage is the ease of change in connection of switch cells controlled simultaneously.

Switch control by the three switch control lines 29A to 29C in FIG. 4 is performed for the following reasons.

When the circuit block 1 is started from a stopped state, there may be a large amount of charge accumulated in the internal voltage lines 11 due to leakage current of the logic circuitry or the like during the operation stop. In such a case, when all switches within the switch block 2 are turned on simultaneously, a high level of noise occurs in the real VSS line. In order to suppress a peak of this noise, the plurality of switch control lines 29A to 29C need to be sequentially controlled to such a potential as to be able to switch on in consideration of a maximum value of the amount of charge accumulated in the internal voltage lines 11.

However, the number of switch cells simultaneously turned on by the switch control lines, the position of the cells, timing of control of the plurality of switch control lines, and the like depend on many parameters such as a stop time of the circuit block, an extent of the leakage and the like, and are thus difficult to estimate. Thus, the number of switch cells connected to each switch control line and the like may have to be changed according to a result of validation of operation after the design. In such a case, it takes time and cost to modify each of the four kinds of switch blocks 2.

In the present embodiment, because the same switch cells are arranged in the form of a matrix, the size of switches necessary for three systems controlled by the respective switch control lines (total gate width: a sum total of lengths for which gate electrodes intersect active regions) can be varied by merely changing the "number" of switch cells connected to each switch control line without changing the disposition of the switch cells. Thus, the present layout method has an advantage of ease of design change.

As described above, the present embodiment adopts a constitution in which switch cells of a pattern to which the present invention is applied are arranged in the form of tiles, so that switch blocks can be designed easily as compared with creating the layout of the whole of MTCMOS switch blocks by custom design. When the size of MTCMOS switch blocks as a whole, the number of switch systems, or multi-control is desired to be changed, in particular, provision can be made flexibly for changing the number of MTCMOS switch cells or changing upper layer wiring for a control signal. In addition, switch cell design itself is made easily.

It is thus possible to realize a semiconductor integrated circuit having switch cells suitable for ASIC design of "MTCMOS switch blocks."

<Second Embodiment>

In the present embodiment, any one or an arbitrary combination of a plurality of pieces of wiring or the like connected to power supply lines such, for example, as a power supply voltage line, a reference voltage line, and an internal voltage line 11 are arranged annularly on the periphery of a power shutoff object circuit block 1. A switch block 2 includes a voltage line segment forming the annularly arranged wiring (annular rail line) as one constituent element of the switch block 2. It is thereby possible to easily move a switch block 2 after design and increase or decrease the number of switch blocks 2 along the annular rail line by only a simple change in connection.

In the following description, the same constituent elements as in the first embodiment are identified and quoted by the same reference numerals.

Figure 7:
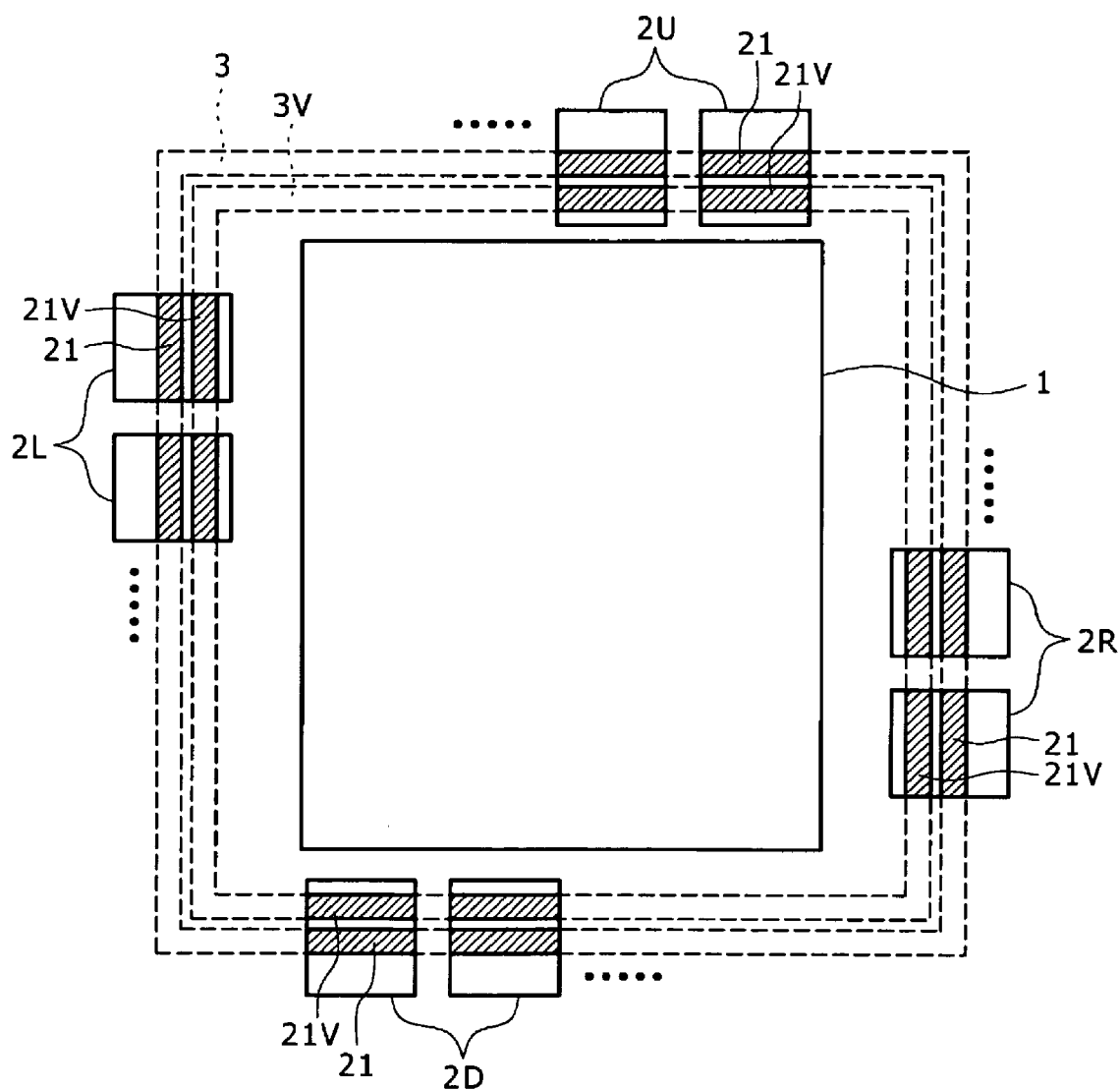
FIG. 7 is a diagram showing a rail arrangement according to a second embodiment.

FIG. 7 shows an example of a configuration having two annular rail lines corresponding to a second power supply line (real VSS line) and a virtual VSS line connected to an internal voltage line 11.

As illustrated in FIG. 7, a plurality of switch blocks 2 are arranged in proximity to four sides of a power shutoff object circuit block 1 in such a manner as to enclose the circuit block 1. In this case, for convenience, the switch blocks 2 are classified into upper switch blocks 2U, lower switch blocks 2D, right switch blocks 2R, and left switch blocks 2L for the respective sides of the power shutoff object circuit block 1. The upper switch blocks 2U have a same configuration; the lower switch blocks 2D have a same configuration; the right switch blocks 2R have a same configuration; and the left switch blocks 2L have a same configuration.

The four kinds of switch blocks 2U, 2D, 2R, and 2L each have a voltage line segment 21, a voltage line segment 21V, and a switch not shown in FIG. 7.

The voltage line segment 21 is represented by a broken line in FIG. 7. The voltage line segment 21 is a wiring part forming a part of an annular rail line 3 that forms a closed annular line around the power shutoff object circuit block 1. Similarly, the virtual voltage line segment 21V represented by a broken line is a wiring part forming a part of a virtual annular rail line 3V that forms a closed annular line around the circuit block 1.

In a stage of design of arrangement wiring, the annular rail line 3 and the virtual annular rail line 3V are disposed and connected to the switches and the like at a wiring stage after the switches (a plurality of switch cells 20N) are arranged. After the annular rail line 3 and the virtual annular rail line 3V are once disposed and connected, constituent elements (including a switch) other than a voltage line segment 21 are moved in a unit of a switch block 2U, 2D, 2R, or 2L, and the switch and the like are connected to the annular rail line 3 and the virtual annular rail line 3V at a position after the moving. Incidentally, in FIG. 7, connection wiring for connection between an internal voltage line 11 (see FIG. 2) within the power shutoff object circuit block 1 and the switch needs to be changed each time the switch block is moved. However, the trouble of changing connection wiring for connecting the annular rail line 3 and the virtual annular rail line 3V to the switch is saved, and thus it is correspondingly easy to move the switch.

Similarly, in a case of inserting switch blocks, a necessary number of switch blocks are inserted at necessary positions with constituent elements other than voltage line segments 21 and virtual voltage line segments 21V within the switch blocks as units, and switches and the like are connected to the annular rail line 3 and the virtual annular rail line 3V at the positions.

Similarly, in a case of deleting a switch, the switch is deleted with constituent elements other than a voltage line segment 21 and a virtual voltage line segment 21V within the switch block as a unit.

Even in inserting or deleting a switch, the trouble of changing connection wiring for connecting the annular rail line 3 and the virtual annular rail line 3V to the switch is saved, and it is correspondingly easy to move the switch.

In order to enable this free design change, it is necessary that the switch blocks 2U, 2D, 2R, and 2L have a same size and that end side positions of voltage line segments 21 and virtual voltage line segments 21V at two opposed sides of block frames of the switch blocks 2U, 2D, 2R, and 2L which opposed sides are crossed by the annular rail line 3 and the virtual annular rail line 3V be standardized (fixed).

Incidentally, in a case where the end side positions are not standardized, the pattern of the voltage line segment 21 and the virtual annular rail line 3V needs to be modified so as to connect end sides to each other between adjacent switch blocks after the constituent elements other than the voltage line segment 21 and the virtual voltage line segment 21V of a switch block are moved along the annular rail line 3 and the virtual annular rail line 3V, inserted, or deleted. However, this work is a simple operation of connecting the end sides and can thus be automated. Thus, switch arrangement is changed much more easily than in a case of manually performing again connection wiring connecting switches to an annular line disposed outside the switches using a wiring layer at another level after arranging the switches.

Though not shown in FIG. 7, as in the first embodiment, a plurality of switch control lines may be arranged, depending on the number of groups of switches controlled simultaneously.

Figure 8:
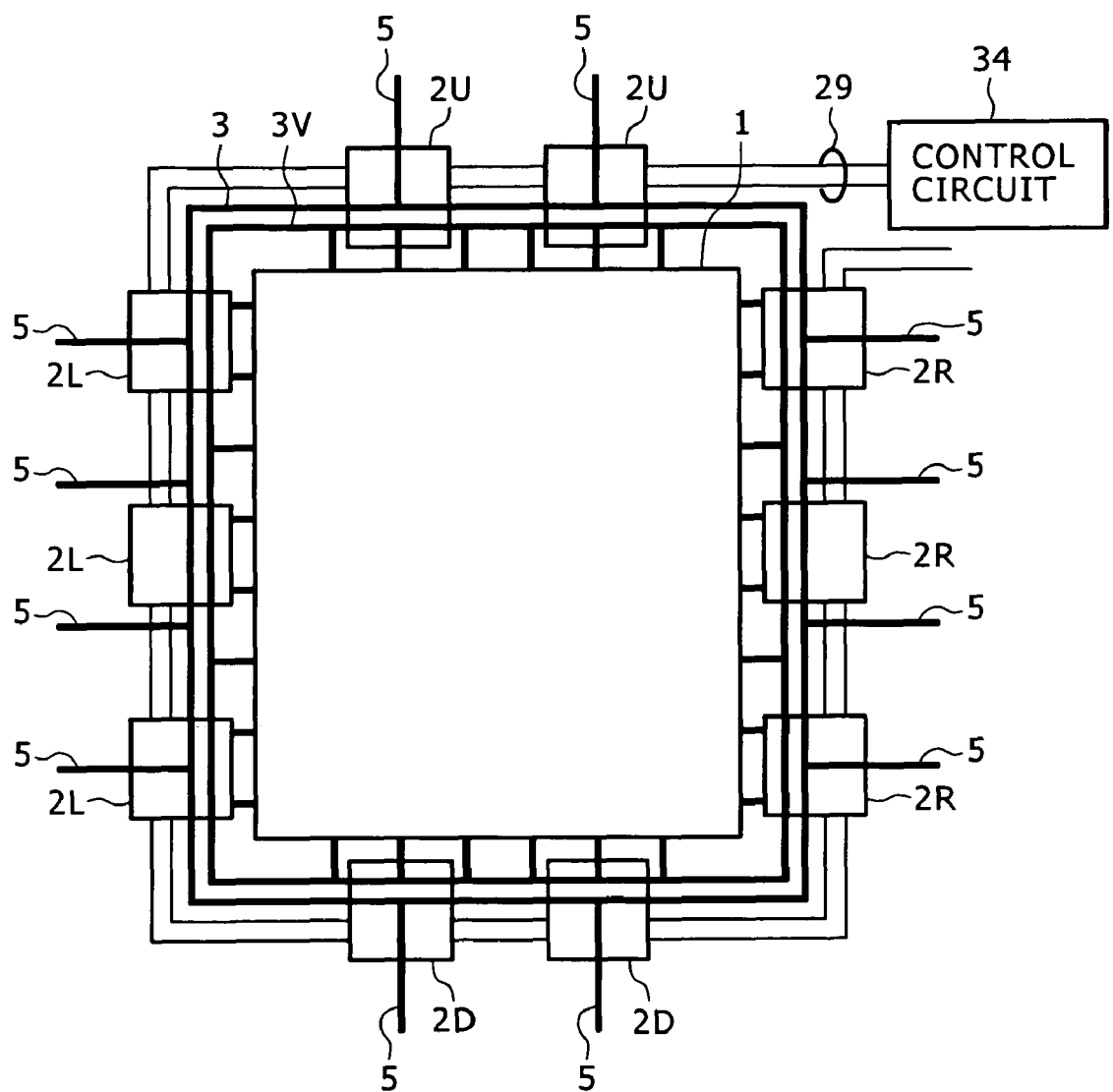
FIG. 8 is a diagram showing wiring of a switch control line for a circuit block and switch blocks on the periphery of the circuit block in the second embodiment.

FIG. 8 is a diagram showing an example of arrangement of two control lines.

A control circuit 34 shown in FIG. 8 is, for example, provided in an MTCMOS non-applied circuit block such as the energized circuit block 32 or the non-applied circuit blocks 33 in FIG. 1. The control circuit 34 can thereby operate at all times while supplied with power after the semiconductor integrated circuit is started. A control line 29 from the control circuit 34 is routed to upper switch blocks 2U, left switch blocks 2L, lower switch blocks 2D, and right switch blocks 2R in this order, and a control signal is applied in this order. The control signal controls the conduction and nonconduction of a switch within each switch block.

Figure 9:
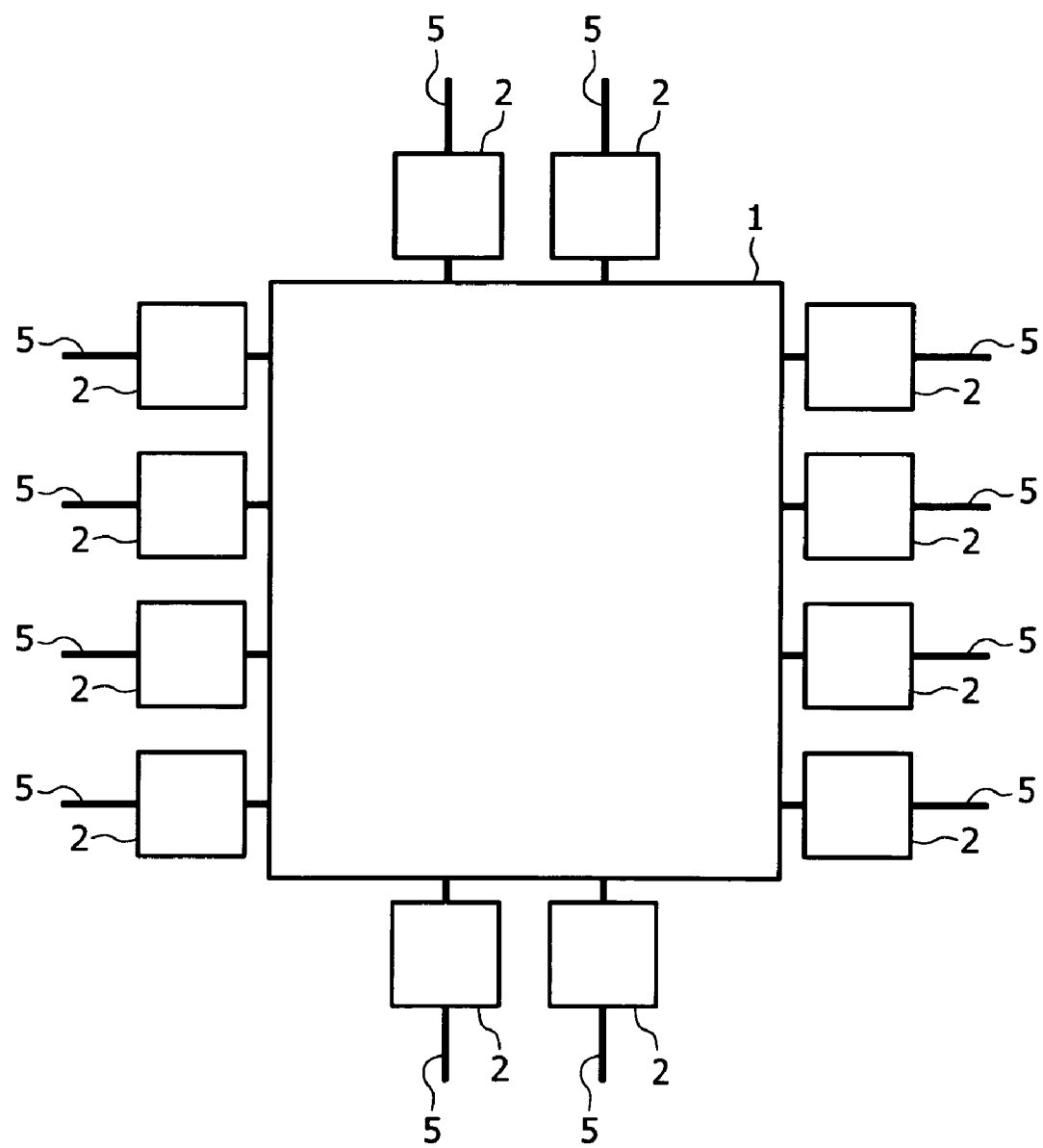
FIG. 9 is a block diagram showing a configuration without an annular rail line according to the first embodiment, the block diagram being used in the description of the second embodiment.

Incidentally, the configuration shown in FIG. 8 is provided with branches of real VSS wiring at predetermined positions of an annular rail line 3 so as to be usable as a replacement for a configuration without an annular rail line (the configuration of the first embodiment) which configuration is shown in FIG. 9.

In the external SW arrangement configuration of the first embodiment which configuration is shown in FIG. 9, pieces of global real VSS wiring 5 are connected to a power shutoff object circuit block 1 via switch blocks 2.

The annular rail line 3 shown in FIG. 8 is connected to real VSS wiring 5 at 2 positions in the row direction and 4 positions in the column direction.

On the other hand, a virtual annular rail line 3V is connected to a power shutoff object circuit block 1 at 6 positions in the row direction and 8 positions in the column direction.

These connection positions do not need to be changed at all when a switch block 2U, 2D, 2R, or 2L is moved, inserted, or deleted.

An example in which switch control is performed by two control lines 29, or to be more precise, an example of configuration of switch blocks will next be described with reference to drawings.

Figure 10A:
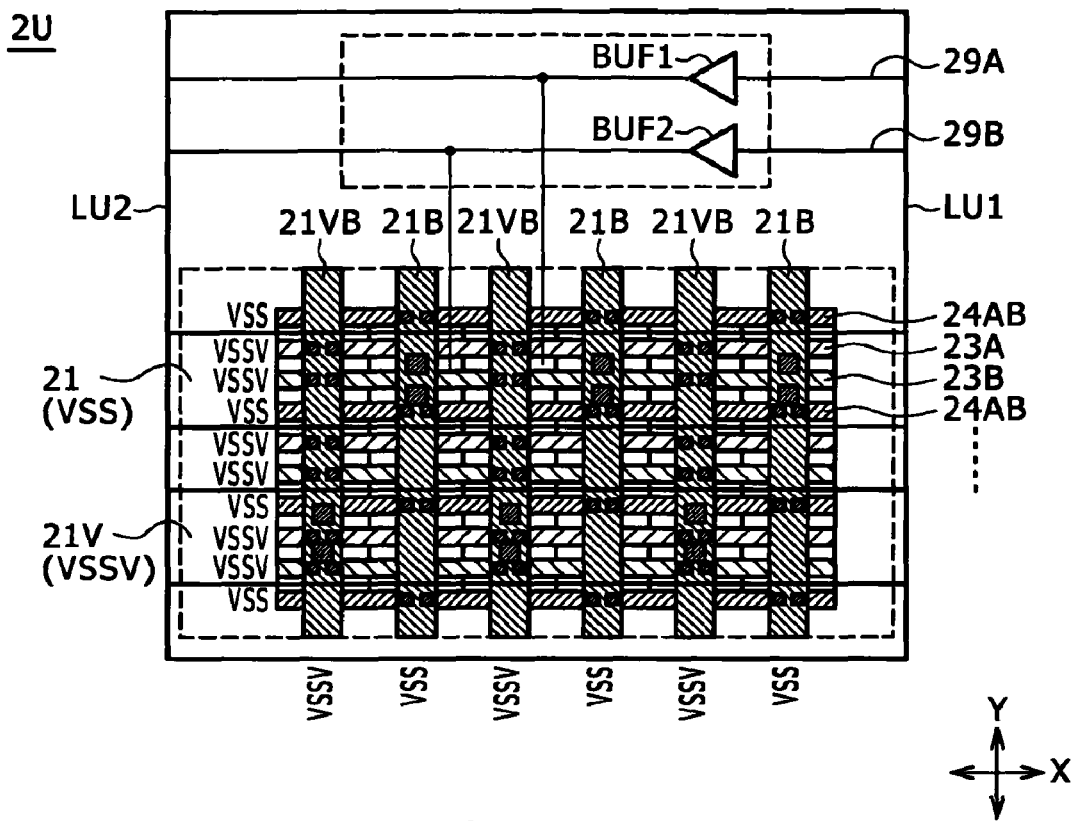
FIGS. 10A and 10B relate to the second embodiment, FIG. 10A being a diagram of a configuration of an upper switch block, and FIG. 10B being a diagram of a configuration of a lower switch block.
Figure 10B:
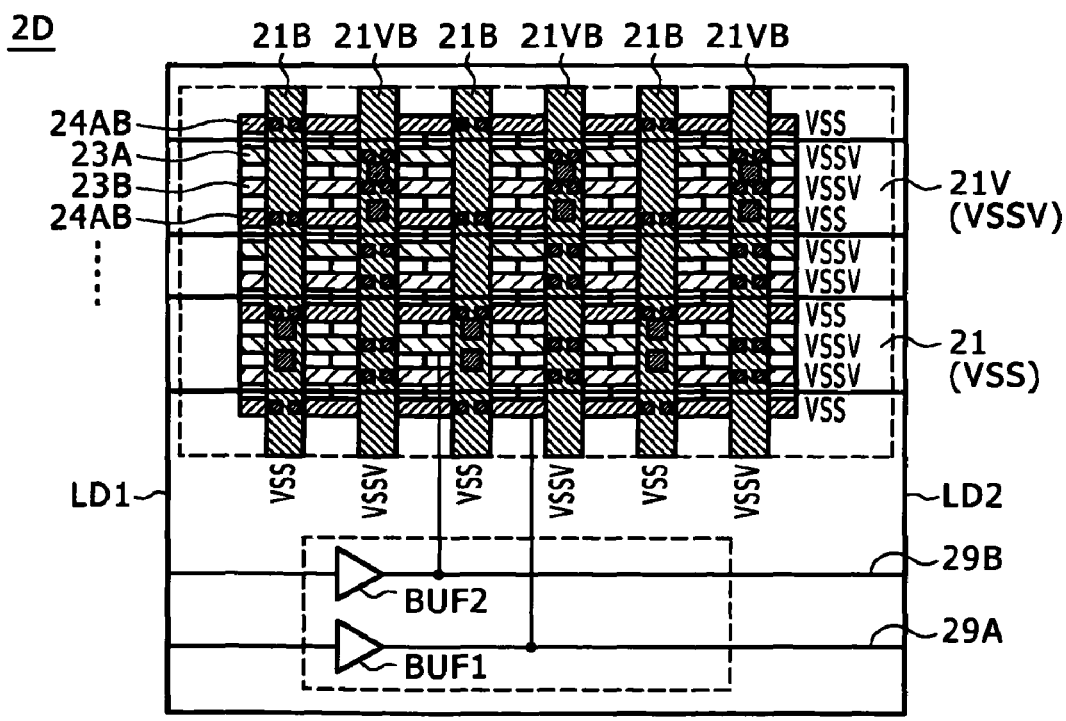
Figure 11A:
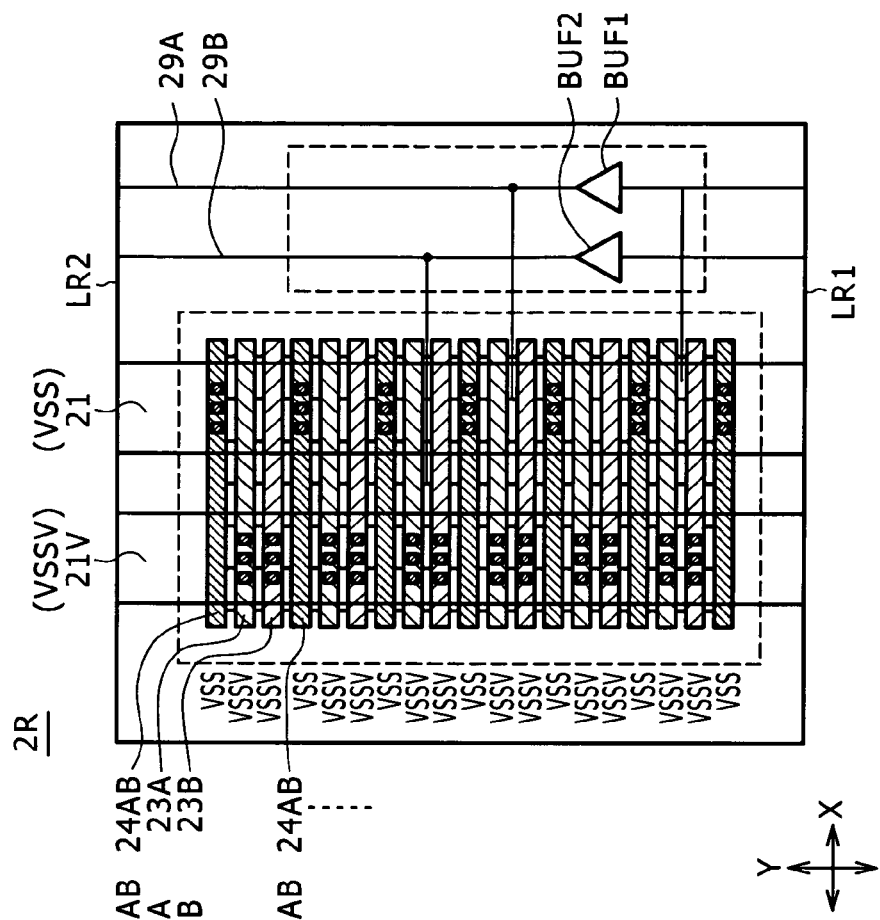
FIGS. 11A and 11B relate to the second embodiment, FIG. 11A being a diagram of a configuration of a left switch block, and FIG. 11B being a diagram of a configuration of a right switch block.
Figure 11B:
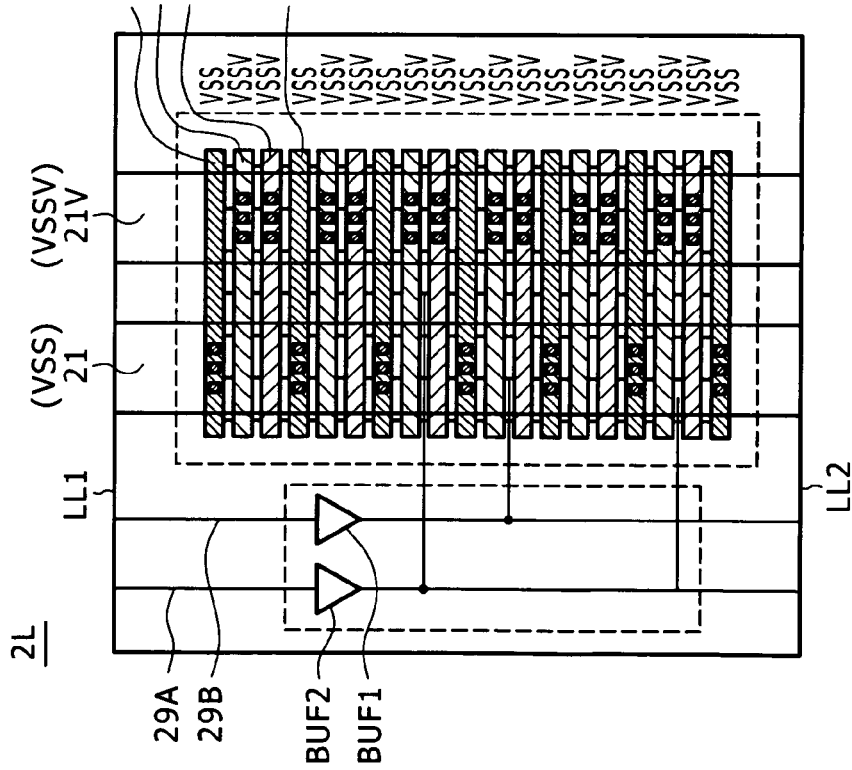

In terms of correspondence with FIG. 4, FIG. 10A shows an upper switch block 2U, FIG. 10B shows a lower switch block 2D, FIG. 11A shows a left switch block 2L, and FIG. 11B shows a right switch block 2R.

The four kinds of switch blocks 2U, 2D, 2R, and 2L have a same size. In this case, the sides (hereinafter referred to as connection sides) of a block frame at which sides the reference voltage VSS, the virtual reference voltage VSSV, and the control signal are input and output, that is, sides LU1 and LU2 in FIG. 10A, sides LD1 and LD2 in FIG. 10B, sides LL1 and LL2 in FIG. 11A, and sides LR1 and LR2 in FIG. 11B are set at a same length. In addition, the respective end sides of a voltage line segment 21, a virtual voltage line segment 21V, a switch control line 29A, and a switch control line 29B are standardized at same positions at any of these connection sides.

In this case, the switch control line 29A controls a number of switch cells 20N (see FIG. 4) controlled first, and the switch control line 29B controls a number of other switch cells 20N.

The switch blocks 2U, 2D, 2R, and 2L shown in FIGS. 10A and 10B and FIGS. 11A and 11B have the voltage line segment 21 and the virtual voltage line segment 21V arranged in parallel with each other in such a manner as to be superimposed over a switch arrangement region enclosed by a broken line. This provides an advantage of reducing an area occupied by the blocks.

Thus, the switch control lines 29A and 29B cannot be arranged in the switch arrangement region as in FIG. 4 with a limited number of layers of multilayer wiring structure. Hence, in the present example, the switch control lines 29A and 29B are disposed outside the switch arrangement region on an outer side opposite from the power shutoff object circuit block 1.

The left switch block 2L and the right switch block 2R shown in FIGS. 11A and 11B have 6 switch cells 20N as shown in FIG. 5 in an X-direction (horizontal direction of the figures) and 6 switch cells 20N as shown in FIG. 7 in a Y-direction (vertical direction of the figures), that is, a total of 36 switch cells arranged therein.

On the other hand, while the upper switch block 2U and the lower switch block 2D shown in FIGS. 10A and 10B have a total of 36 switch cells 20N, which number is the same as in FIGS. 11A and 11B, the upper switch block 2U and the lower switch block 2D have 12 switch cells 20N arranged in the X-direction and 3 switch cells 20N arranged in the Y-direction.

The reason is that a switch cell 20N has a large size in the Y-direction as compared with that in the X-direction, and that to meet a need to make the direction of length of gate electrodes the same Y-direction in FIGS. 10A and 10B and FIGS. 11A and 11B, aspect ratios of switch arrangement regions housed within switch blocks having the same size are adjusted to the vertical size and the horizontal size of the switch blocks, the vertical size and the horizontal size of the switch blocks being interchanged in FIGS. 10A and 10B and FIGS. 11A and 11B.

In the case of FIGS. 11A and 11B, the voltage line segment 21 and the virtual voltage line segment 21V each intersect all of voltage cell lines 23A and 23B and power cell lines 24AB. Thus, the voltage line segment 21 can be connected to all the power cell lines 24AB in a lower layer via contacts, and the virtual voltage line segment 21V can be connected to all the voltage cell lines 23A and 23B in the lower layer via contacts.

In the case of FIGS. 10A and 10B, on the other hand, the voltage line segment 21 and the virtual voltage line segment 21V do not intersect all the lower layer wiring to which to provide contacts. Thus, as shown in FIGS. 10A and 10B, in the upper switch block 2U and the lower switch block 2D, branch lines 21B from the voltage line segment 21 and branch lines 21VB from the virtual voltage line segment 21V need to be provided to be connected to the target lower layer wiring.

The total gate width of the switch cells 20N controlled by the switch control line 29A (a sum total obtained by multiplying the number of the cells by effective length of the gate electrodes 21A and 21B in FIG. 5) is set to be the same in FIGS. 10A and 10B and FIGS. 11A and 11B. Similarly, the total gate width of the remaining switch cells 20N controlled by the switch control line 29B is set to be the same in FIGS. 10A and 10B and FIGS. 11A and 11B.

Each of the switch blocks 2U, 2D, 2R, and 2L has a buffer circuit BUF1 provided at an intermediate point of the switch control line 29A and a buffer circuit BUF2 provided at an intermediate point of the switch control line 29B on an opposite side (outside) of the switch arrangement region from the circuit block 1.

The buffer circuits BUF1 and BUF2 are connected to the real VDD line not shown in the figure and the voltage line segment 21 to thereby perform a function of shaping the waveform of the control signal attenuated in a process of being transmitted into that of a pulse signal having the amplitude of power supply voltage VDD. Thus, a buffer circuit arrangement region represented by a broken line is provided on the outside of the switch arrangement region.

Wiring for switch control extends from each output of the buffer circuits BUF1 and BUF2 to the switch arrangement region, and is connected to the control cell lines 25 of a corresponding switch cell group.

Incidentally, this wiring as well as the switch control line 29A and the switch control line 29B is represented by a line in FIGS. 10A and 10B and FIGS. 11A and 11B, but is actually formed by a wiring layer having a similar width to that of the voltage line segment 21 and the like.

The switch control line 29A and the switch control line 29B each include, within the switch block, a "first control line segment" that is provided on the input side of the corresponding buffer circuit BUF1 or BUF2 and to which the control signal is input and a "second control line segment" that is provided on the output side of the corresponding buffer circuit BUF1 or BUF2 and to which the waveform-shaped control signal is output.

Figure 12:
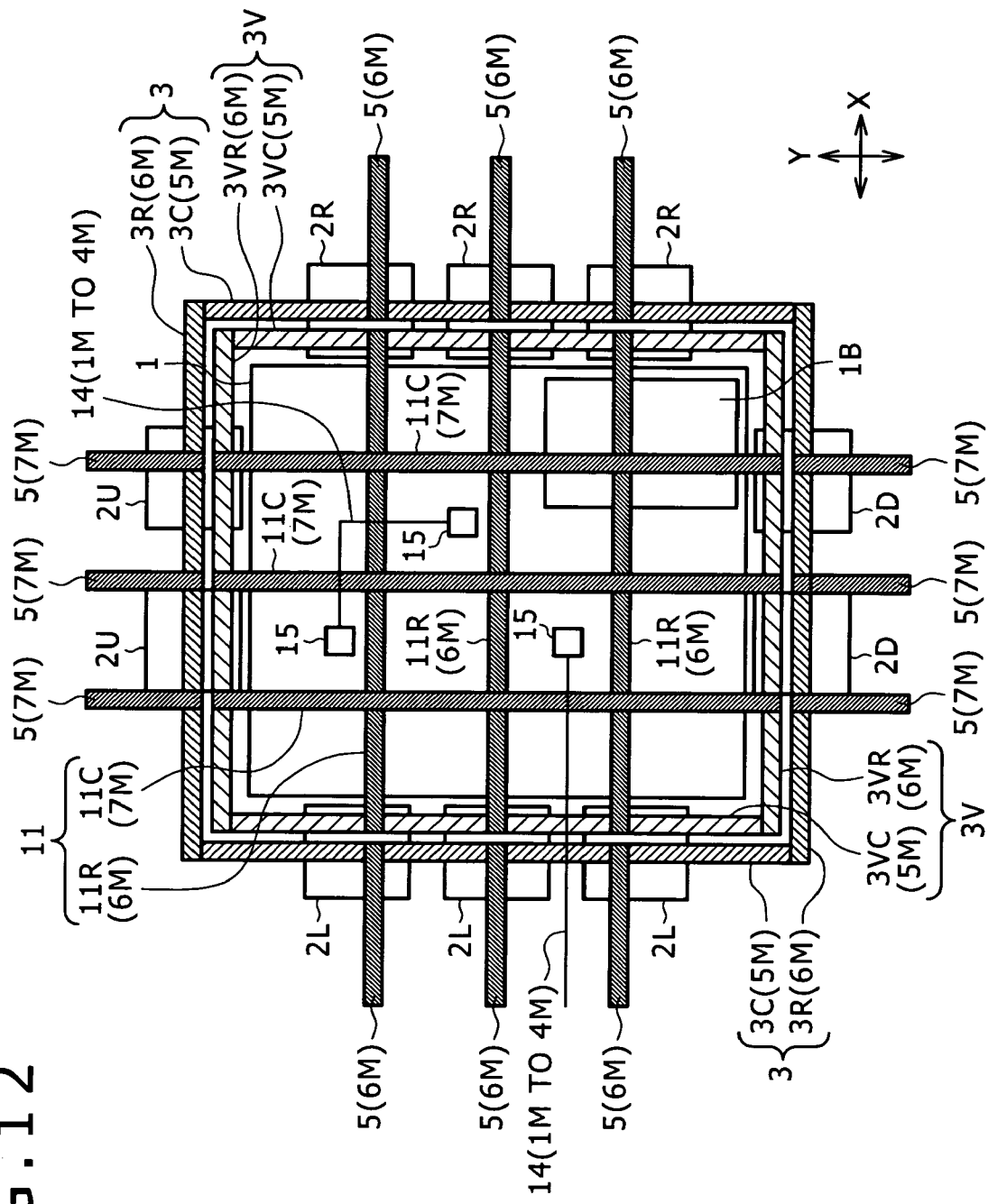
FIG. 12 is a diagram showing use conditions of wiring layers at respective levels in a multilayer wiring structure according to the embodiment by references 1M to 7M.

FIG. 12 shows an example of use of wiring layers at respective levels in a multilayer wiring structure. In this case, each piece of wiring is formed using a wiring layer at a first level (a first wiring layer (1M)) to a wiring layer at a seventh level (a seventh wiring layer (7M)) laminated in order from the bottom layer in the multilayer wiring structure.

Specifically, wiring between standard cells 15 such as the inverter cell 13 (FIG. 2) and the like within the power shutoff object circuit block 1 is formed of the first wiring layer (1M) to the fourth wiring layer (4M). A signal line routed from a certain standard cell 15 to the outside is also formed of the first wiring layer (1M) to the fourth wiring layer (4M).

Wiring 3C in the Y-direction of the annular rail line 3 is formed of the fifth wiring layer (5M). Wiring 3R in the X-direction of the annular rail line 3 is formed of the sixth wiring layer (6M) higher by one level than the fifth wiring layer (5M) and connected to both ends of the wiring 3C in the Y-direction.

Similarly, wiring 3VC in the Y-direction of the virtual annular rail line 3V is formed of the fifth wiring layer (5M). Wiring 3VR in the X-direction of the virtual annular rail line 3V is formed of the sixth wiring layer (6M) higher by one level than the fifth wiring layer (5M) and connected to both ends of the wiring 3VC in the Y-direction.

Wiring 11R in the X-direction of the internal voltage lines 11 is formed of the sixth wiring layer (6M) higher by one level than the fifth wiring layer (5M) to be connected to the wiring 3VC in the Y-direction of the virtual annular rail line 3V, the wiring 3VC being formed of the fifth wiring layer (5M). Further, the wiring 11R in the X-direction of the internal voltage lines 11, the wiring 11R being formed of the sixth wiring layer (6M), is connected to wiring 11C in the Y-direction of the internal voltage lines 11, the wiring 11C being formed of the seventh wiring layer (7M) higher by one level than the sixth wiring layer (6M), at intersections of the wiring 11R and the wiring 11C.

Incidentally, the real VSS wiring 5 is also formed by the seventh wiring layer (7M).

Thus, inter-wiring connection is achieved well by forming the wiring in the Y-direction out of wiring lower by one level than the wiring in the X-direction and applying this rule.

The semiconductor integrated circuit according to the present embodiment has the first advantage (ease of design of switch blocks), the second advantage (ease of switch cell design itself), and the third advantage (ease of change in connection of switch cells controlled simultaneously), as in the first embodiment.

In addition, the semiconductor integrated circuit according to the present embodiment has the following advantages relating to the annular rail line structure.

The plurality of switch blocks arranged on the periphery of the power shutoff object circuit block 1 have a switch and a voltage line segment as a part of the annular rail line to which the power supply voltage or the reference voltage is applied.

Thus, a switch segment can be, as it were, freely moved along the annular rail line, newly inserted, or deleted easily by merely moving, inserting, or deleting the switch block in a state in which positional relation between the voltage line segment and the switch is fixed.

Figure 13:
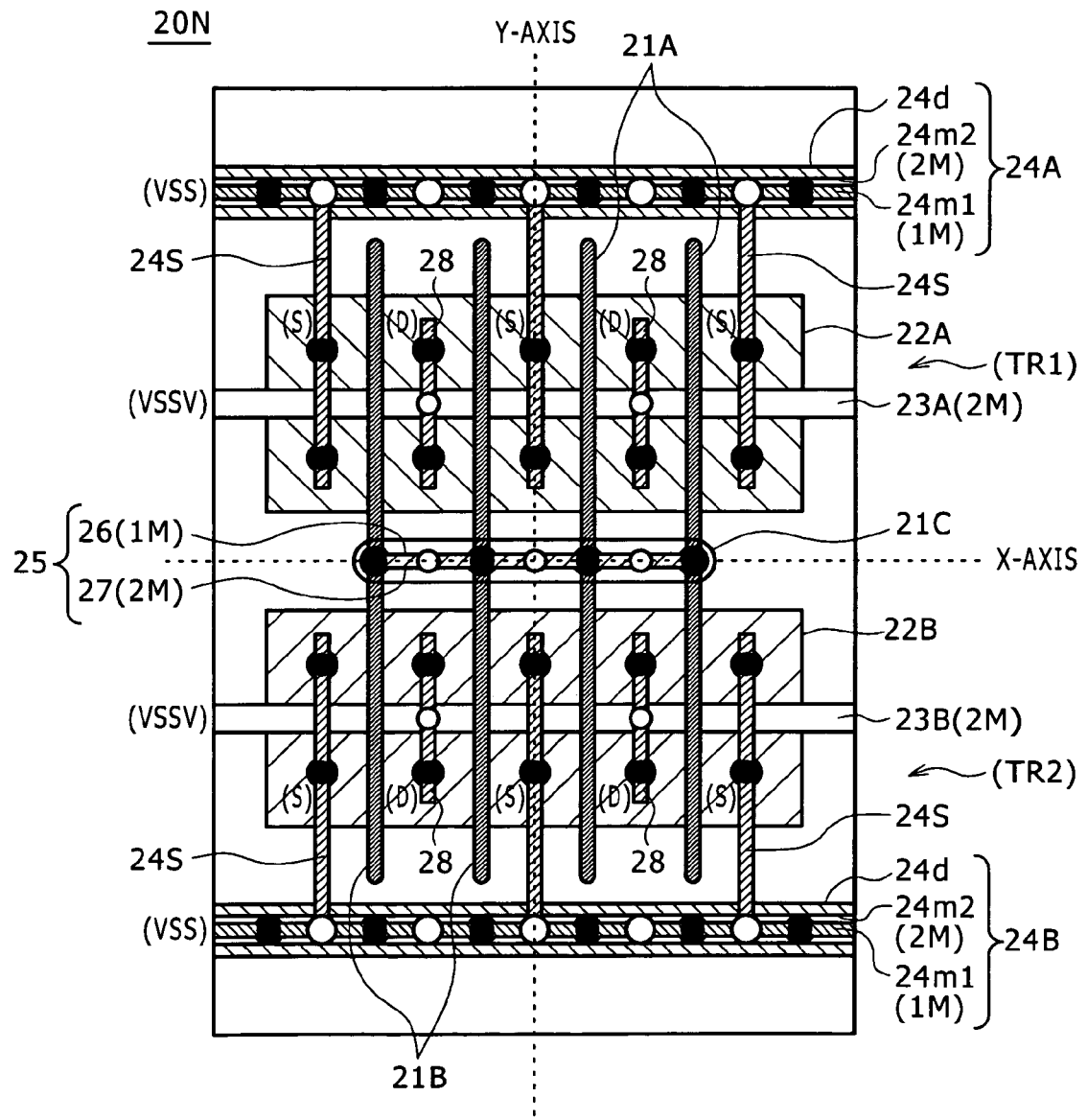
FIG. 13 is a diagram showing a proper arrangement of switch blocks in the second embodiment.

In particular, as shown in FIG. 13, a plurality of switch blocks are arranged such that the lower the impedance of wiring (specifically the real VSS wiring 5 and the annular rail line 3 in the description of the present embodiment) supplying the power supply voltage or the reference voltage to the power shutoff object circuit block 1 as viewed from each of four sides of the circuit block 1, the larger the number of switch blocks.

In FIG. 13, the impedance of a side indicated by a thick arrow is lower than that of a side indicated by a thin arrow. That is, because input-output cells 40 shown in FIG. 1 are arranged on the side of the thick arrow, the external reference voltage assumes a value of approximately 0 [V]. On the other hand, because another circuit block (for example, the energized circuit block 32) operating at all times is disposed on the side indicated by the thin arrow, a time average of the potential of a real VDD line is higher than 0 [V].

In such a case, when many switch blocks are disposed on the side where the reference voltage is fixed at 0 [V], the discharging of the internal voltage lines 11 progresses more efficiently within a same switch-on time. On the other hand, when many switches are disposed on the side where the reference voltage is higher than 0 [V], the number of switch blocks needs to be increased to obtain the same discharging effect, thus leading to wastefulness.

The present embodiment has an effect of enabling such an efficient switch block arrangement to be made easily.

Specifically, provisions can be made at a time of determining power consumption in a latter half of design, and the number of switch blocks being used can be reduced as compared with the case in related art. When the total gate width of switch transistors is reduced by decreasing the number of switch blocks, a leakage current is correspondingly decreased, so that a power reduction effect is obtained. In addition, because there is no operating circuit block on the side of the input-output cells 40, there is a small effect of power supply noise due to a discharge, and an adverse effect on the operating speed of other circuit blocks can be suppressed.

In addition, because the annular line to which the power supply voltage or the reference voltage is applied can be disposed so as to be superimposed on the switch, a great effect of area reduction is obtained.

<Third Embodiment>

The present embodiment relates to a semiconductor integrated circuit having symmetrically arranged switch cells as in FIG. 5 or FIG. 6 embedded in a region for arranging standard cells forming a logic circuit or the like.

In other words, the general configuration of the semiconductor integrated circuit according to the present embodiment is a constitution for realizing the functions of switch blocks 2 within a power shutoff object circuit block 1 rather than the configuration in which switch blocks 2 are arranged on the periphery of a power shutoff object circuit block 1 as in the foregoing first and second embodiments.

However, in the following description, similar parts of wiring, cells and the like to those of the foregoing embodiments are identified and quoted by the same reference numerals, referring to drawings illustrating the parts.

Figure 14:
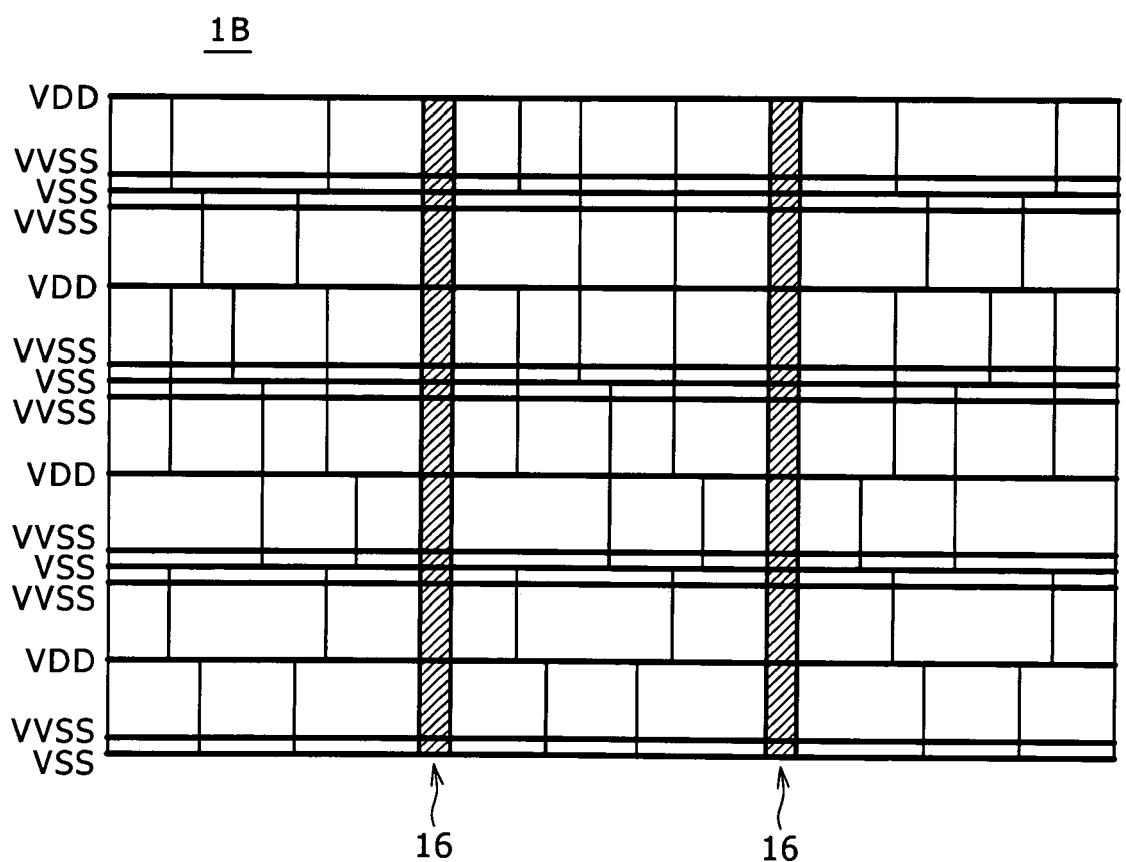
FIG. 14 is a schematic diagram of basic arrangement of a standard cell arrangement region of a circuit block according to a third embodiment.

FIG. 14 is a schematic diagram of basic arrangement of a standard cell arrangement region of a circuit block in which switch cells as in FIG. 5 or FIG. 6 are embedded.

In the standard cell arrangement region 1B illustrated in FIG. 14, the size of standard cells in a column direction, that is, a vertical direction of FIG. 14 is fixed. Thus, seven cell lines that are long in a row direction, that is, a horizontal direction of FIG. 14 are formed with a same width.

Predetermined standard cells 15 of various sizes in the row direction are arranged in each cell line.

The example of FIG. 14 supposes that the power supply path of each standard cell 15 on a reference voltage VSS side is subjected to shutoff control by an NMOS transistor.

Therefore, each standard cell 15 has a VDD line at one end in the column direction, a VSS line at another end, and a VSSV line in proximity to the VSS line. Hence, after cell arrangement in a cell line, the VDD line, the VSS line, and the VSSV line are connected within the cell line, and are each formed as a piece of wiring that is long in the row direction (row direction wiring) as shown in FIG. 14.

Of the three kinds of row direction wiring, the VDD line and the VSS line are shared between cells adjacent to each other in the column direction. Hence, viewing the whole of FIG. 14, the single VDD line and three lines, which are one VSS line and two VSSV lines with the VSS line interposed between the two VSSV lines, are alternately repeated in the column direction.

Incidentally, while in the foregoing first embodiment, an inverter cell 13 has been described as an example of a standard cell 15 with reference to FIG. 3, the pattern shown in FIG. 3 supposes that power shutoff is controlled not only on the VSS side but also on the VDD side.

In order to change this pattern such that the pattern can be disposed in FIG. 14, it is desirable to omit the VDDV line 133P shown in FIG. 3, and connect (integrally form) the three source lines 135P formed by the first wiring layer (1M) with the lining wiring 134Pm forming the VDD line 134P.

The four VDD lines and the four VSS lines shown in FIG. 14 are desirably connected by low-resistance trunk wiring to eliminate potential differences. Further, when the whole of the standard cell arrangement region 1B shown in FIG. 14 is set as an MTCMOS applied region, it is desirable to interconnect the seven VSSV lines.

As a constitution for interconnecting each piece of wiring, as for the VSSV lines, for example, "virtual VSS lines" similar to the internal voltage lines 11 in FIG. 2 may be provided in the form of a lattice, and the VSSV lines in FIG. 14 may be arranged as branch lines of the "virtual VSS lines." Similarly, the VDD lines in FIG. 14 may be provided as branch lines of "real VDD lines" arranged in the form of a lattice, and the VSS lines in FIG. 14 may be provided as branch lines of "real VSS lines" arranged in the form of a lattice. Incidentally, the "virtual VSS lines" are wiring only within the power shutoff object circuit block 1, while the "real VDD lines" and the "real VSS lines" are electrically connected to other circuit blocks by wiring between the blocks.

Each cell line in the present embodiment includes a switch cell arrangement region at periods of a fixed length. Thus, viewed as a whole, the switch cell arrangement regions of respective cell lines are connected to each other in the column direction, and switch cell regions 16 long in the column direction are formed at fixed intervals in the row direction, as shown by hatch lines in FIG. 14.

While the width (length in the row direction) of each of the switch cell regions 16 is a minimum in FIG. 14, the width of each of the switch cell regions 16 can be set arbitrarily to a multiple of (once or more) the width of switch cells being used such as the switch cell shown in FIG. 5 or FIG. 6 or the like.

When a plurality of switch control lines 29A, 29B, ... each controlling a predetermined number of switch cells simultaneously are provided as described above, the switch cell regions 16 are enlarged to secure an arrangement region for a necessary number of switch cells. In this case, an image of a switch cell region 16 is similar to FIG. 4, for example. A plurality of switch control lines (the switch control lines 29A to 29C in FIG. 4) are arranged in the column direction (the Y-direction in FIG. 4) within the switch cell region 16 using a wiring layer higher than switch cells 20N. Then, as in FIG. 4, the necessary number of switch cells are connected to each switch control line using a wiring layer at an even higher level or the like (the wiring layer may be at a lower level).

Incidentally, wiring regions in the column direction of the "virtual VSS lines," the "real VDD lines," and the "real VSS lines" and the switch cell regions 16 may be shared. In this case, the "virtual VSS lines," the "real VDD lines," and the "real VSS lines" may be arranged using a wiring layer at an even higher level in FIG. 4, for example.

According to the present embodiment, as in the first and second embodiments, the switch cell regions 16 are all of the same configuration, so that pattern data does not need to be inverted by mirror inversion or the like and there is no advantage of "ease of design of switch blocks," which has been described as the first advantage of the first embodiment. However, as with the first embodiment, the present embodiment provides advantages of "ease of switch cell design" and "ease of change in connection of switch cells controlled simultaneously," which advantages have been described as the second advantage and the third advantage.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising:
a circuit block having a first power supply line to which a power supply voltage and a reference voltage is applied, an internal voltage line, and a circuit cell connected between said first power supply line and said internal voltage line; and
a plurality of switch cells each including two voltage cell lines each connected electrically to said internal voltage line, two power cell lines each connected electrically to a second power supply line to which another power supply voltage and said reference voltage is applied, a control cell line electrically connected to a switch control line, and a transistor electrically connected between said internal voltage line and said second power supply line;
wherein said switch cells are arranged on all of four sides of a periphery of said circuit block,
in each of said plurality of switch cells, said control cell line passes through a cell center, and is disposed in one direction,
said two voltage cell lines are arranged in parallel with said control cell line and in parallel with each other at positions equally distant from said control cell line with said control cell line interposed between said two voltage cell lines, and
said two power cell lines are arranged in parallel with said control cell line and in parallel with each other at positions equally distant from said control cell line with said control cell line interposed between said two power cell lines.

2. The semiconductor integrated circuit according to claim 1, further comprising
a plurality of unit transistors,
wherein said plurality of unit transistors are connected in parallel with each other between said voltage cell lines and said power cell lines, respective control nodes of said plurality of unit transistors are connected to each other via said control cell line disposed in an X-direction, and said plurality of unit transistors are formed in a pattern axisymmetric with respect to each of said X-direction passing through a pattern center of said control cell line and a Y-direction orthogonal to said X-direction.

3. The semiconductor integrated circuit according to claim 2, wherein a first transistor and a second transistor arranged symmetrically with respect to said control cell line are disposed as said plurality of unit transistors, respective gate electrodes of said first transistor and said second transistor extend on dividing regions dividing an active region of said first transistor on a semiconductor substrate and an active region of said second transistor on said semiconductor substrate, said control cell line is formed including a first wiring layer connected to the respective gate electrodes of said first transistor and said second transistor above said dividing regions, wiring for connecting one of a source and a drain of said first transistor and one of said two power cell lines to each other and wiring for connecting one of a source and a drain of said second transistor and another of said two power cell lines to each other are formed by said first wiring layer, and said two voltage cell lines electrically connected to another of said source and said drain and said two power cell lines are formed by one of a second wiring layer higher by one level than said first wiring layer and a wiring layer higher than said second wiring layer.

4. The semiconductor integrated circuit according to claim 1, wherein said plurality of switch cells arranged on all of the four sides of the periphery of said circuit block are arranged in an orientation such that length directions of gates of said transistors are identical with each other.

5. A method of arranging and wiring a plurality of switches disposed outside a circuit block in which a first power supply line to which a power supply voltage and a reference voltage is applied and an internal voltage line are arranged, and a circuit cell is connected between said first power supply line and said internal voltage line, said method comprising the steps of:

forming a switch cell by disposing a transistor, arranging each of two voltage cell lines each connected electrically to said internal voltage line, two power cell lines each connected electrically to a second power supply line to which another power supply voltage and said reference voltage is applied, and a control cell line electrically connected to a switch control line axisymmetrically with respect to each of an X-axis and a Y-axis passing through a cell center, and connecting each of the two voltage cell lines, the two power cell lines, and the control cell line to said transistor;

forming a switch block by arranging formed said switch cells in a form of a matrix and connecting predetermined said switch cells to each of a plurality of said switch control lines;

forming an inverted switch block by mirror-inverting created data on said switch block on a line parallel to one of said X-axis and said Y-axis, or rotating the created data on said switch block by 180 degrees (inverted by 180 degrees) on said cell center;

disposing a predetermined number of formed said switch blocks and disposing a predetermined number of formed said inverted switch blocks on a periphery of said circuit block; and connecting said plurality of switch control lines and said second power supply line between said switch blocks and said inverted switch blocks that have been disposed, and connecting said voltage cell lines to said internal voltage line of said circuit block.

* * * * *